(12) United States Patent
Itakura et al.

(10) Patent No.: US 7,425,838 B2
(45) Date of Patent: Sep. 16, 2008

(54) BODY FOR KEEPING A WAFER AND WAFER PROBER USING THE SAME

(75) Inventors: Katsuhiro Itakura, Itami (JP); Masuhiro Natsuhara, Itami (JP); Hirohiko Nakata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/485,624

(22) Filed: Jul. 13, 2006

(65) Prior Publication Data
US 2007/0024299 A1 Feb. 1, 2007

(30) Foreign Application Priority Data
Jul. 13, 2005 (JP) .............................. 2005-203749

(51) Int. Cl.
*G01R 31/02* (2006.01)
(52) U.S. Cl. ...................... 324/754; 324/760
(58) Field of Classification Search ................ 324/754, 324/760; 269/20
See application file for complete search history.

(56) References Cited
U.S. PATENT DOCUMENTS
5,034,688 A * 7/1991 Moulene et al. ............. 324/760

6,328,096 B1 * 12/2001 Stone et al. ................. 165/80.1
2003/0155939 A1 * 8/2003 Lutz et al. .................... 324/760
2004/0046578 A1 * 3/2004 Uher et al. ................... 324/754

FOREIGN PATENT DOCUMENTS

| JP | 2001-033484 A | 2/2001 |
|----|---------------|--------|
| JP | 2002-64133 | 2/2002 |
| JP | 2002-83667 | 3/2002 |
| JP | 2004-128509 | 4/2004 |
| JP | 2005-064313 | 3/2005 |

OTHER PUBLICATIONS

Office Action dated Dec. 19, 2006.
Japanese Office Action, with English translation, Japanese Patent Application No. JP 2005-203749, mailed Jul. 25, 2007.

* cited by examiner

*Primary Examiner*—Minh N Tang
(74) *Attorney, Agent, or Firm*—McDermott Will & Emery LLP

(57) ABSTRACT

According to the invention, there is provided a wafer holding member for use in a wafer prober for inspecting a semiconductor wafer, including a chuck top and a supporting member for supporting the chuck top, wherein the supporting member has a bottom portion facing to the chuck top, a cavity portion is formed between the chuck top and the bottom portion of the supporting member, and there is provided, in the cavity portion, at least a portion of a cooling mechanism for cooling at least one of the chuck top and the supporting member. Further, there is provided a wafer prober using the wafer holding member.

21 Claims, 6 Drawing Sheets

BODY FOR KEEPING A WAFER AND WAFER PROBER USING THE SAME

This nonprovisional application is based on Japanese Patent Application No. 2005-203749 filed with the Japan Patent Office on Jul. 13, 2005 the entire contents of which are hereby incorporated by reference.

BACKGROUND OF THE INVENTION

1. Field of the Invention

The present invention relates to a wafer holding member for use in a wafer prober for inspecting a semiconductor wafer and the wafer prober including the wafer holding member.

2. Description of the Background Art

Conventionally, inspection processes for a semiconductor wafer include processing of heating the semiconductor wafer which is a to-be processed object. The heating processing includes a burn-in process for heating the semiconductor wafer to a temperature higher than an usual usage temperature for acceleratingly degrading the qualities of semiconductor chips which may become defective products and eliminating such semiconductor chips, thereby preventing occurrence of defective products after shipment.

In the burn-in process, before the semiconductor wafer having circuit formed thereon is cut into the individual semiconductor chips, measurement of electric characteristics of the respective semiconductor chips are performed while the semiconductor wafer is kept heated and, thus, defective products are removed therefrom. There has been a strong need for reducing processing time of the burn-in process, in order to increase throughput.

The aforementioned burn-in process is performed using a heater unit for heating the semiconductor wafer, wherein the heater unit includes a wafer holding member for holding the semiconductor wafer. Conventional heater units employ a flat-plate shaped metal plate as the wafer holding member, since there is a need for bringing an entire back surface of the semiconductor wafer into contact with ground electrodes.

In the burn-in processing, the semiconductor wafer having the circuit formed thereon is placed on a wafer placing surface of the wafer holding member made of the metal plate, and measurement of the electric characteristics of the semiconductor chips is performed. During measurement of the electric characteristics of the semiconductor chips, a probing device including a large number of energizing probe pins, called a probe card, is pressed against the semiconductor wafer with a force in a range between several tens of kgf and several hundreds kgf. Accordingly, if the wafer holding member has a small thickness, the wafer holding member may be deformed, thereby causing poor contact between the semiconductor wafer and the probe pins. Therefore, in order to ensure rigidity of the wafer holding member, it has been necessary to employ a thick metal plate with a thickness of 15 mm or more as the wafer holding member, which has made it necessary to take a longer time period for raising and reducing the temperature of the semiconductor wafer. This has been such obstruction in increasing the throughput.

Further, in the burn-in process, an electric current is fed to the semiconductor chips for measurement of the electric characteristics thereof. Along with increase in outputs of the semiconductor chips in recent years, heat generation from the semiconductor chips during measurement of the electric characteristics thereof is increased, which may sometimes cause fractures of the semiconductor chips due to self heating thereof. Accordingly, there has been a need for rapidly cooling down the semiconductor chips after measurement of the electric characteristics thereof. Further, there is a need for uniformizing heat over the semiconductor chips during measurement of the electric characteristics and, therefore, copper (Cu) with a heat conductivity of 403 W/mK, namely with a high heat conductivity, has been employed as materials of the metal plates constituting the wafer holding members.

Japanese Patent Laying-Open No. 2001-033484 (Patent Document 1) suggests a wafer holding member constituted by a ceramic substrate with a small thickness but higher rigidity which is less prone to deformation and a thin metal layer formed on the surface of the ceramic substrate, instead of the wafer holding member made of the thick metal plate. Patent Document 1 describes that this wafer holding member causes no poor contact between the semiconductor wafer and the probe pins since it has higher rigidity and, also, the wafer holding member enables raising and reducing the temperature of the semiconductor wafer within shorter time periods since it has a smaller heat capacity. Further, Patent Document 1 describes that aluminum alloy and stainless steel can be employed as a supporting table for installing the wafer holding member thereon.

However, when the wafer holding member is supported only at its outermost periphery by the supporting table as described in Patent Document 1, the wafer holding member may be warped due to the pressing pressure of a probe card and, therefore, there has been a need for further contrivance such as supporting the wafer holding member with a plurality of supporting columns, in addition to the supporting table.

Further, in recent years, along with miniaturization of semiconductor processes, force applied to the semiconductor chip per unit area during probing has been increased and, also, there has been a need for higher accuracy in positioning the probe card and the wafer holding member. In general, the wafer holding member repeatedly performs operations of heating the semiconductor wafer to a predetermined temperature, moving to a predetermined position during probing, and pressing the probe card against the semiconductor wafer. At this time, in order to enable moving the wafer holding member to the predetermined position, a driving system therefor is required to have high accuracy.

However, when the semiconductor wafer is heated to the predetermined temperature, for example, temperature in a range of 100 to 200° C., heat thereof transfers to the driving system to cause thermal expansion of metal components constituting the driving system, thereby causing a problem of degradation in accuracy of the driving system. Further, due to increase in force applied during probing, the wafer holding member for placing the semiconductor wafer thereon is required to have rigidity, which has increased size and weight of the wafer holding member, thereby causing a problem of adverse influence by the increased weight on accuracy of the driving system. Further, along with the increase in size of the wafer holding member, there has been a need of significantly longer time periods for raising and reducing the temperature of the semiconductor wafer, thereby causing a problem of reduction in the throughput.

In order to reduce the time periods for raising and reducing the temperature of the semiconductor wafer to increase the throughput, the wafer holding member is provided with the cooling mechanism, in many cases. Conventional cooling mechanisms perform air cooling as described in, for example, Patent Document 1, and cooling plates made of metal are provided beneath the wafer holding members. However, the former case has a problem of a low cooling rate due to air cooling. The latter case has a problem that the cooling plate is prone to deformation since it is made of metal and the pressure by the probe card is directly applied to the cooling plate during probing.

SUMMARY OF THE INVENTION

As described above, in recent years, in the wafer prober for inspecting the semiconductor wafer, accuracy in positioning the wafer holding member with respect to the probe card has been significantly important. The driving system for driving the wafer holding member is required to move the wafer holding member with higher accuracy, in order to move the semiconductor wafer to the predetermined position.

However, if heat from the chuck top in the wafer holding member is transferred to the driving system, this will cause thermal expansion of the metal components and the like in the driving system, which will degrade accuracy thereof and increase difficulty in positioning the wafer holding member with respect to the probe card, causing obstruction in performing inspection on the semiconductor wafer. Particularly, in recent years, along with miniaturization of the circuit formed on the semiconductor wafer, there has been a need for the driving system with particularly higher accuracy.

Therefore, it is an object of the present invention to provide a wafer holding member for a wafer prober, capable of improving accuracy in positioning the wafer holding member, and the wafer prober including the same. It is another object of the present invention to provide the wafer holding member for the wafer prober, capable of increasing cooling rate for cooling a chuck top of the wafer holding member to increase throughput, and the wafer prober including the same.

According to the present invention, there is provided a wafer holding member for use in a wafer prober for inspecting a semiconductor wafer, including a chuck top and a supporting member for supporting the chuck top, wherein the supporting member has a bottom portion facing to the chuck top, a cavity portion is formed between the chuck top and the bottom portion of the supporting member, and there is provided, in the cavity portion, at least a portion of a cooling mechanism for cooling at least one of the chuck top and the supporting member.

In the wafer holding member according to the present invention, the cooling mechanism may include a flow channel for flowing a fluid therethrough.

Further, in the wafer holding member according to the present invention, a plate-shaped member may be provided on at least one of a surface of the flow channel facing to the chuck top and a surface of the flow channel facing to the bottom portion of the supporting member.

Also, in the wafer holding member according to the present invention, at least a portion of the cooling mechanism may be provided in the cavity portion near the bottom portion of the supporting member. In this case, the description "at least a portion of the cooling mechanism is provided in the cavity portion near the bottom portion of the supporting member" means that at least a portion of the cooling mechanism is provided in a region closer to the bottom portion of the supporting member than the chuck top, in the cavity portion within the wafer holding member.

Also, in the wafer holding member according to the present invention, at least the portion of the cooling mechanism may be provided in the cavity portion near the chuck top. In this case, the description "at least a portion of the cooling mechanism is provided in the cavity portion near the chuck top" means that at least the portion of the cooling mechanism is provided in a region closer to the chuck top than the bottom portion of the supporting member, in the cavity portion within the wafer holding member.

Further, in the wafer holding member according to the present invention, the cooling mechanism may be of a movable type.

Further, according to the present invention, there is provided a wafer prober including the aforementioned wafer holding member.

Therefore, according to the present invention, there is provided the wafer holding member for the wafer prober, capable of improving accuracy in positioning the wafer holding member, and the wafer prober including the same. Further, according to the present invention, there is provided the wafer holding member for the wafer prober, capable of increasing cooling rate for cooling the chuck top of the wafer holding member to increase the throughput, and the wafer prober including the same.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
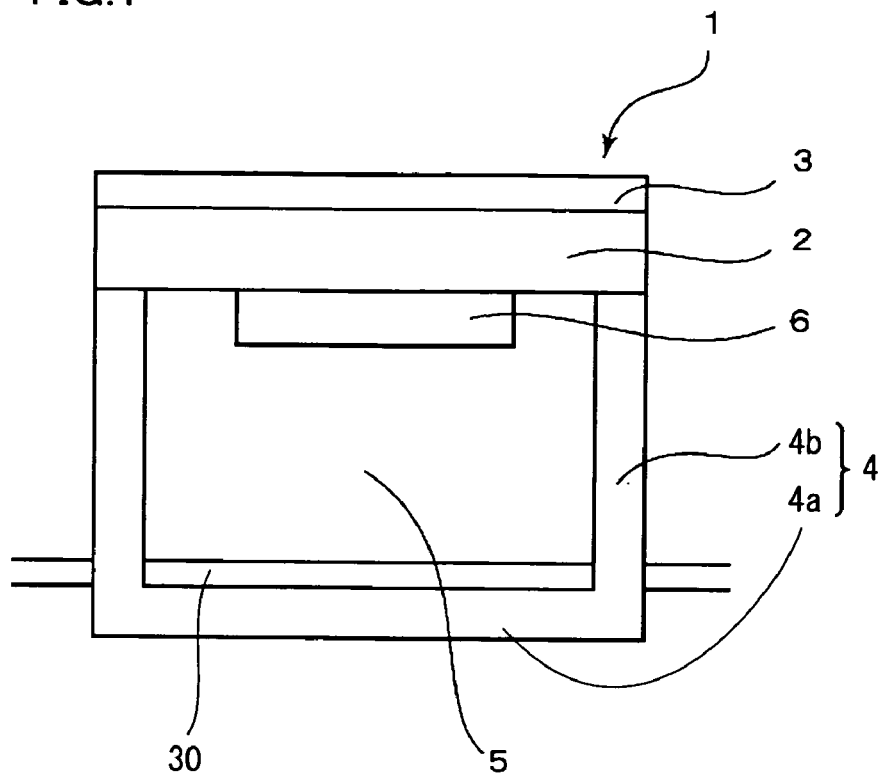
FIG. 1 is a schematic cross-sectional view of an exemplary wafer holding member according to the present invention.

Hereinafter, an embodiment of the present invention will be described. In the drawings of the present invention, same reference characters will designate same or corresponding portions.

FIG. 1 illustrates a schematic cross-sectional view of an exemplary wafer holding member according to the present invention. Here, a wafer holding member 1 according to the present invention includes a disk-shaped chuck top 2 as a wafer holding member main portion and a supporting member 4 for supporting chuck top 2, wherein a chuck-top conductive layer 3 is formed on a surface of chuck top 2.

In this case, supporting member 4 is constituted by a disk-shaped bottom portion 4a facing to chuck top 2 and a cylindrical-shaped side portion 4b for supporting chuck top 2, wherein a hollow cavity portion 5 is formed between bottom portion 4a of supporting member 4 and chuck top 2.

Further, inside cavity portion 5, there are provided, for example, a cooling pipe 30 as a flow channel constituting a portion of a cooling mechanism and a heating member 6 for heating chuck top 2. Cooling pipe 30 is installed so as to penetrate through cavity portion 5 from outside of wafer holding member 1.

Here, gas or liquid for cooling chuck top 2 and/or supporting member 4 is flowed through cooling pipe 30 to cool chuck top 2 and/or supporting member 4. Further, one or more cooling pipes 30 may be installed and, when a plurality of cooling pipes 30 are installed, for example, it is preferable that the cooling pipes 30 are installed such that they are in contact with bottom portion 4a of supporting member 4 as much as possible and gaps between adjacent cooling pipes 30 are made as small as possible. Therefore, cooling pipes 30 can be formed to have, for example, a triangular or rectangular cross-sectional shape to make a contact area between cooling pipes 30 and the bottom surface of supporting member 4 greater and also to make the gaps between adjacent cooling pipes 30 as small as possible. Further, protrusions can be formed on an inner wall of each cooling pipe 30 to increase a contact area between the inner wall of each cooling pipe 30 and the fluid, thereby increasing cooling efficiency.

Also, cooling pipe 30 can be secured to bottom portion 4a of supporting member 4. For example, cooling pipe 30 can be secured with screws to bottom portion 4a of the supporting member through a metal band, which can mechanically secure cooling pipe 30 to bottom portion 4a of supporting member 4. Also, cooling pipe 30 can be bonded to bottom portion 4a of supporting member 4 through a soldering material to secure cooling pipe 30 to bottom portion 4a of supporting member 4.

Also, cooling pipe 30 can be secured to the surface of chuck top 2 facing to supporting member 4. For example, cooling pipe 30 can be secured with screws to the surface of chuck top 2 facing to supporting member 4 through a metal band or the like, which can mechanically secure cooling members 30 to the surface of chuck top 2 facing to supporting member 4, thereby increasing efficiency of cooling chuck top 2. Also, cooling pipe 30 can be bonded to the surface of chuck top 2 facing to supporting member 4 through a soldering material.

Figure 2:
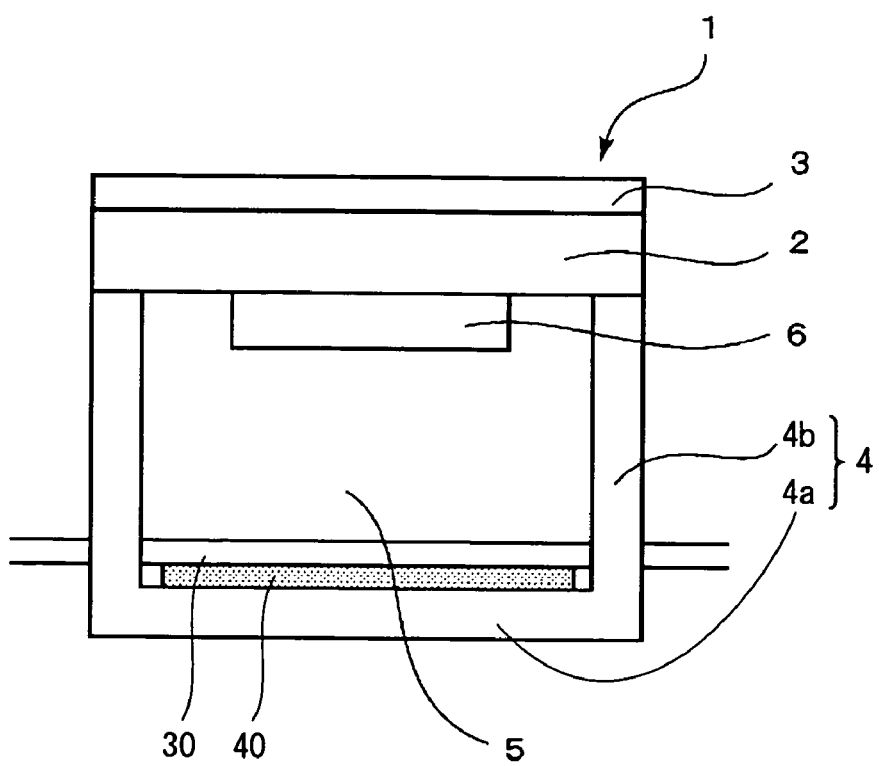
FIG. 2 is a schematic cross-sectional view of another exemplary wafer holding member according to the present invention.
Figure 3:
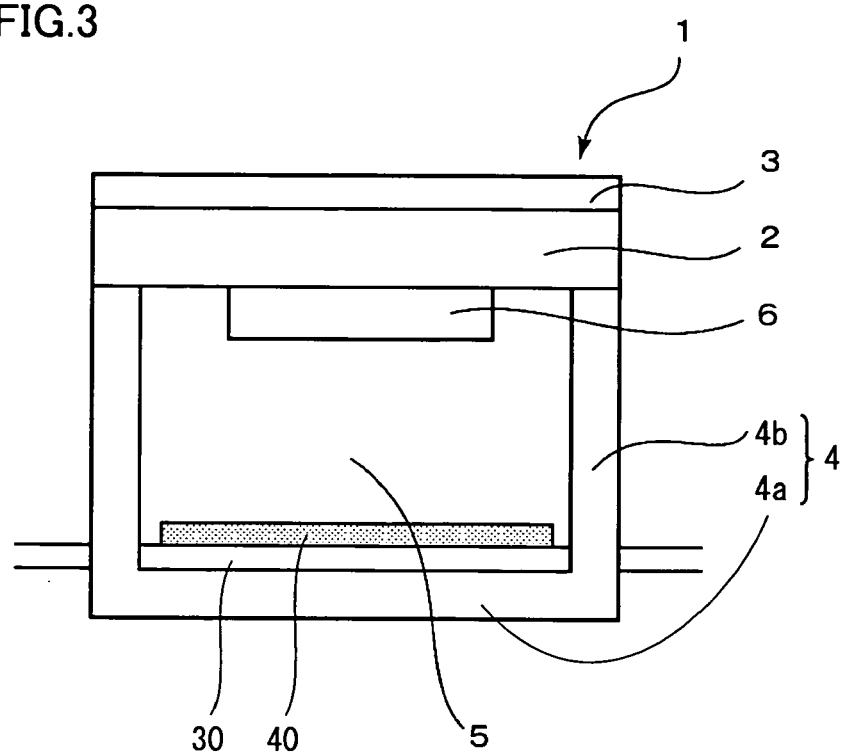
FIG. 3 is a schematic cross-sectional view of another exemplary wafer holding member according to the present invention.

FIG. 2 illustrates a schematic cross-sectional view of another exemplary wafer holding member according to the present invention. In this case, the waver holding member 1 according to the present invention is characterized in that a cooling pipe 30 is installed in a cavity portion 5 near the bottom surface 4a of a supporting member 4 and a plate-shaped member 40 is provided on the surface of cooling pipe 30 facing to bottom portion 4a of supporting member 4. When plate-shaped member 40 is sandwiched between cooling pipe 30 and bottom portion 4a of supporting member 4, there is a tendency to increase the contact area between cooling pipe 30 and bottom portion 4a of supporting member 4 through plate-shaped member 40 and, therefore, there is a tendency to increase efficiency of cooling the supporting member 4. Further, in the present invention, as illustrated in FIG. 3, plate-shaped member 40 can be provided on the surface of cooling pipe 30 facing to a chuck top 2.

Figure 11:
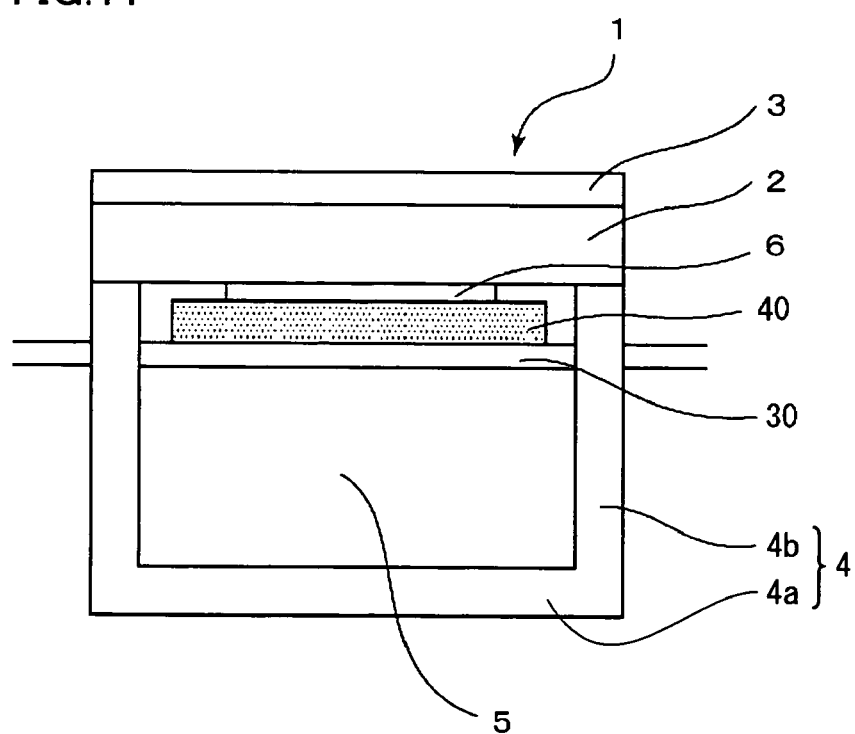
FIG. 11 is a schematic cross-sectional view of another exemplary wafer holding member according to the present invention.
Figure 12:
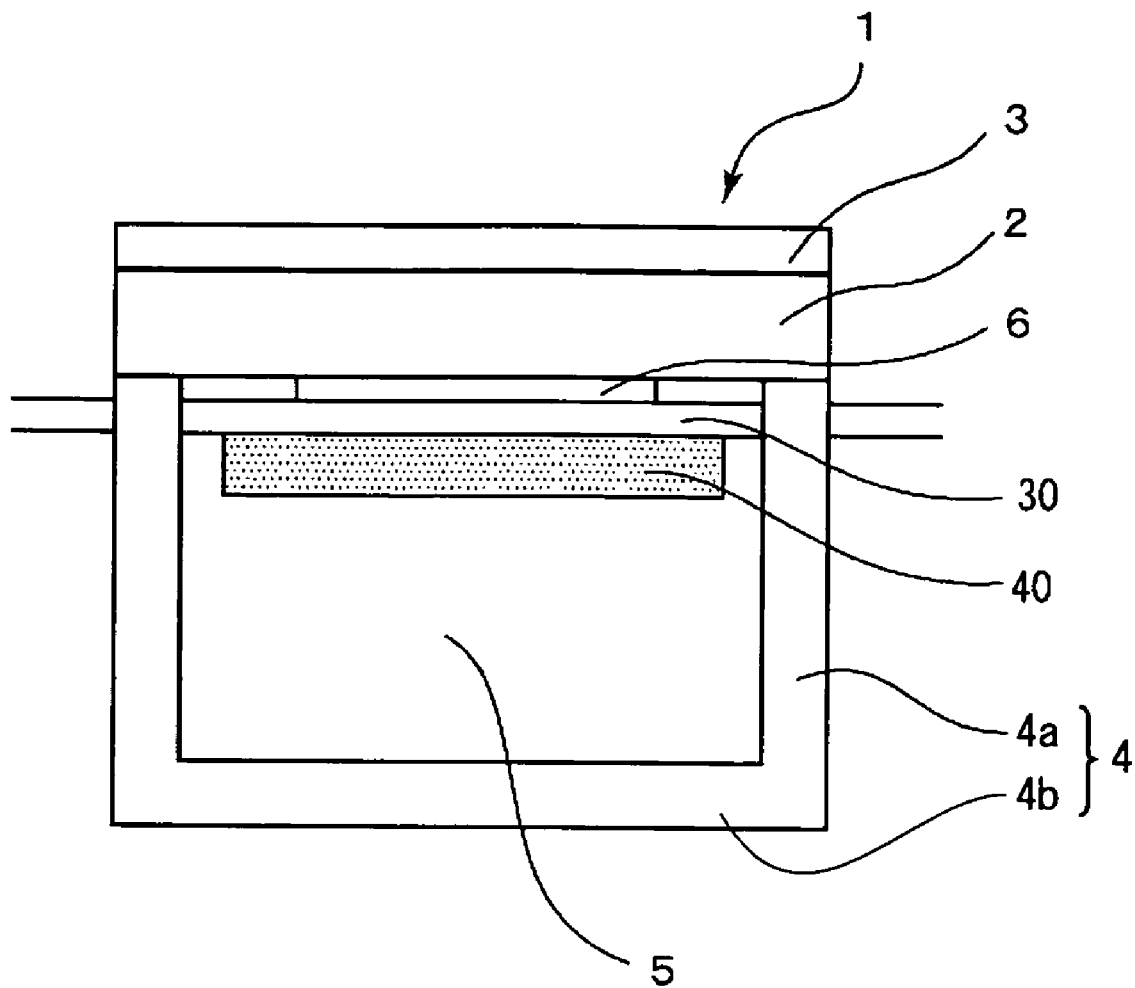
FIG. 12 is a schematic cross-sectional view of another exemplary wafer holding member according to the present invention.

FIG. 11 illustrates a schematic cross-sectional view of another exemplary wafer holding member according to the present invention. In this case, wafer holding member 1 according to the present invention is characterized in that a cooling pipe 30 is installed in a cavity portion 5 near a chuck top 2 and a plate-shaped member 40 is provided on the surface of cooling pipe 30 facing to chuck top 2. This configuration tends to increase the contact area between cooling pipe 30 and chuck top 2 through plate-shaped member 40, thereby tending to increase efficiency of cooling chuck top 2. Further, in the present invention, as illustrated in FIG. 12, plate-shaped member 40 can be provided on the surface of cooling pipe 30 facing to chuck top 2.

In the aforementioned configuration, it is preferable that cooling pipe 30 is bonded to plate-shaped member 40 through mechanical methods, welding or soldering materials, in view of increasing cooling efficiency. There is no particular limitation on the method for bonding cooing pipe 30 to plate-shaped member 40 and, for example, cooling pipe 30 can be installed on plate-shaped member 40 and is secured with screws thereto through a metal band to bond cooling pipe 30 to plate-shaped member 40. Also, it goes without saying that the contact surface between plate-shaped member 40 and cooling pipe 30 is flattened as much as possible.

Also, it is possible to provide a configuration including two plate-shaped members 40 and a cooling pipe 30 sandwiched therebetween. Such a configuration can be formed, for example, by securing two plate-shaped members 40 to each other with screws and then sandwiching cooling pipe 30 between these plate-shaped members 40. Also, it is possible to bond them to one another through welding or a soldering material to form the aforementioned configuration.

Further, plate-shaped member 40 functions to ensure, when it is bonded to a flow channel such as cooling pipe 30 constituting a portion of the cooling mechanism, a sufficient contact area between plate-shaped member 40 and supporting member 4 and/or chuck top 2 to increase cooling efficiency, in comparison with the case of using only the flow channel. Accordingly, it goes without saying that the gap between plate-shaped member 40 and supporting member 4 and the gap between plate-shaped member 40 and chuck top 2 are made as small as possible.

Also, in the case of bonding plate-shaped member 40 to cooling pipe 30, it is possible to apply spot-facing processing to the surface of plate-shaped member 40 to be brought into contact with cooling pipe 30 to shape it into a shape similar to the cross-sectional shape of cooling pipe 30 to increase the contact area between plate-shaped member 40 and cooling pipe 30 for increasing cooling efficiency.

Also, a deformable heat-conductive member having heat conductivity can be installed between plate-shaped member 40 and cooling pipe 30 and bonded thereto to increase cooling efficiency. Although there is no particular limitation on the material of the heat-conductive member, it is preferable to employ a heat-resistant resin such as a silicon resin, an epoxy resin or a phenol resin. Further, in order to increase the heat conductivity, it is possible to add filler made of a ceramic or an inorganic material to the resin.

While there has been described a case of using a mechanism for flowing a cooling gas or liquid through cooling pipe 30 as a cooling mechanism, it is also possible to employ another cooling mechanism in which two plate-shaped members 40 are provided and grooving processing has been applied to at least one of the two plate-shaped members for flowing a cooling fluid therethrough. In this case, two plate-shaped members 40 can be bonded to each other through welding or a soldering material or through a mechanical method such as securing with screws. The bonding method can be determined as required, depending on the type of fluid to be flowed therethrough.

Also, it is possible to employ further a different mechanism in which grooving processing has been applied to the bottom portion of supporting member 4 facing to chuck top 2 and the bottom portion is covered with a plate-shaped member 40 to form a flow channel for flowing a cooling fluid therethrough. In this case, groove processing can be applied to plate-shaped member 40 at its side facing to supporting member 4 without applying grooving processing to supporting member 4 or grooving processing can be applied to both supporting member 4 and plate-shaped member 40.

Also, it is possible to employ further a different mechanism in which grooving processing has been applied to the surface of chuck top 2 which faces to supporting member 4 and the surface is covered with a plate-shaped member 40 to form a flow channel for flowing a cooling fluid therethrough. In this case, groove processing can be applied to the plate-shaped member 40 at its side facing to supporting member 4 without applying grooving processing to chuck top 2 or grooving processing can be applied to both chuck top 2 and plate-shaped member 40.

Also, it is possible to employ a combination of some of the aforementioned cooling mechanisms, as a cooling mechanism.

Further, there is no particular limitation on the cooling gas or liquid to be flowed through the aforementioned flow channel, provided that it is not corrosive to the flow channel. It is possible to employ, for example, air, nitrogen, argon, helium or the like, as a cooling gas. Further, it is preferable to employ water as a cooling liquid, in view of the heat capacity, but if it is leaked from a flow channel, this will significantly affect other apparatuses. Therefore, a solvent such as Galden can be employed. Further, solvents such as Galden can be used at temperatures equal to or below 0° C. and can be cooled relatively efficiently even though they have lower heat capacities.

Further, although there is no particular limitation on the flow rate of the fluid, it is preferable to set the flow rate to 1 liter/min or higher, in view of performing efficient cooling. Further, although there is no particular limitation on the upper limit of the flow rate of the fluid, it is preferable to set the flow rate of the fluid to equal to or less than 300 liter/min. If the flow rate of the fluid exceeds 300 liter/min, this will cause greater pressures to act on the joints of fluid-path pipes, thereby tending to cause fractures at such portions and leakage of the fluid through such portions. Thus, the type and the flow rate of the fluid can be properly selected, according to the object thereof.

Further, there is no particular limitation on the cross-sectional area of the flow channel. However, in view of increasing cooling efficiency, it is preferable that the cross-sectional area of the flow channel is made smaller to some degrees. For example, in the case where the flow channel has a circular cross-sectional area, it is preferable that the cross-sectional area of the flow channel has an inner diameter in the range of 2 mm to 10 mm. If the cross-sectional area of the flow channel has an inner diameter smaller than 2 mm, this will tend to cause greater pressure losses during flowing the fluid. If the cross-sectional area of the flow channel has an inner diameter greater than 10 mm, this will tend to increase the difficulty of realizing efficient cooling.

Further, in the aforementioned configuration, although there is no particular limitation on the materials of cooling pipe 30 as a flow channel and plate-shaped member 40, it is preferable to employ metals, in view of the workability. For example, it is possible to employ a metal such as a stainless steel, copper, aluminum or nickel or an alloy made of them, as the metals used in cooling pipe 30 and/or plate-shaped member 40. Further, it is possible to apply nickel plating, gold plating or other plating to the aforementioned metal to enhance the corrosion resistance of cooling pipe 30 and/or plate-shaped member 40.

Among them, as the metal used in cooling pipe 30 and/or plate-shaped member 40, it is preferable to employ copper or aluminum having higher heat conductivities, in view of increasing cooling efficiency. Cooling pipe 30 and/or plate-shaped member 40 made of copper or aluminum have/has higher heat conductivity, which tends to enable efficiently removing heat therefrom through a fluid.

Further, in the present invention, plate-shaped member 40 can be installed on the surface of cooling pipe 30 as a flow channel which faces to chuck top 2 to bring plate-shaped member 40 into contact with chuck top 2 for cooling chuck top 2.

Figure 10:
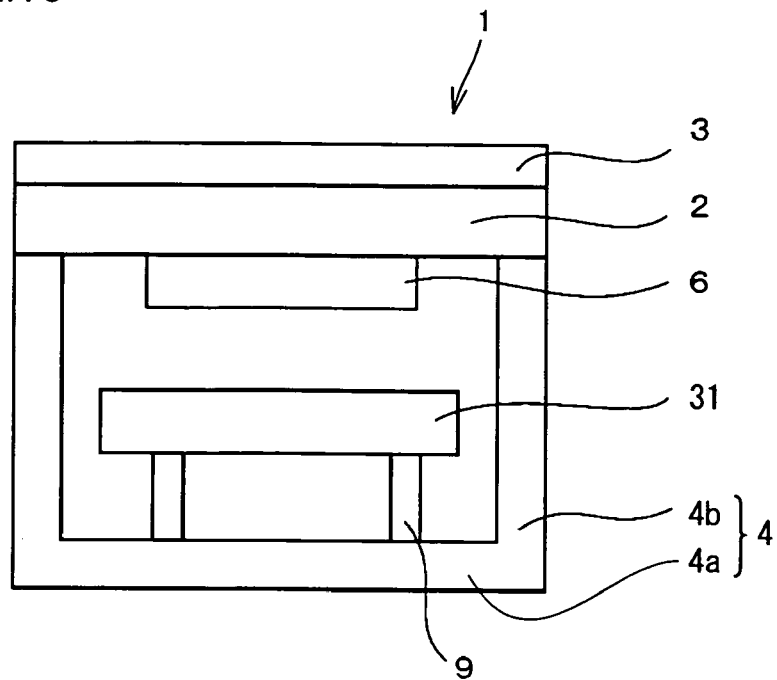
FIG. 10 is a schematic cross-sectional view of another exemplary wafer holding member according to the present invention.

FIG. 10 illustrates a schematic cross-sectional view of another exemplary wafer holding member according to the present invention. Wafer holding member 1 is characterized in that it employs a movable cooling mechanism including a hoisting/lowering portion 9 mounted to the bottom portion 4a of a supporting member 4 and a cooling portion 31 mounted to hoisting/lowering portion 9 and being capable of moving cooling portion 31 upwardly and downwardly through hoisting/lowering portion 9. In the case of using this cooling mechanism, cooling portion 31 is positioned near bottom portion 4a of supporting member 4 during heating a chuck top 2 through a heating member 6 for cooling supporting member 4 with higher efficiency. Further, when there is a need for reducing the temperature of chuck top 2, cooling portion 31 can be moved upwardly and brought into contact with chuck top 2 for efficiently cooling chuck top 2.

Also, as another cooling mechanism, it is possible to employ a cooling mechanism for flowing a cooling fluid between supporting member 4 and chuck top 2. As such a cooling mechanism, for example, there is a method which interposes cooling pipe 30 between supporting member 4 and chuck top 2 and ejects a cooing gas such as air from cooling pipe 30. In this case, the cooling gas can be ejected either from the end portions of cooling pipe 30 or from holes formed through the surface of cooling pipe 30 with the end portions of cooling pipe 30 closed. Further, the number of cooling pipe 30 is not limited to one and may be two or more.

As described above, wafer holding member 1 according to the present invention includes chuck top 2 and supporting member 4 for supporting chuck top 2, wherein there is provided at least a portion of a cooling mechanism in a cavity portion 5 formed between chuck top 2 and bottom portion 4a of supporting member 4 and also there is installed a plate-shaped member 40 as required, which enables cooling chuck top 2 and/or supporting member 4 with higher efficiency. This can maintain the accuracy of the driving system even if chuck top 2 is heated to a high temperature and also can increase the rate of cooling chuck top 2 to increase the throughput.

Further, the wafer holding member 1 according to the present invention preferably includes a heating member 6. This is because probing of semiconductor wafers involves heating the semiconductor wafers to temperatures in the range of 100 to 200° C., in recent years.

If the heat of heating member 6, which heats chuck top 2, can not be prevented from being transferred to supporting member 4, the heat will be transferred to the driving system which is provided under supporting member 4. This will cause accuracy deviation, due to the difference in thermal expansion among the components of the driving system, thereby causing significant degradation of the flatness and the parallelism of the wafer placing surface (surface of a chuck-top conductive layer 3, in this case) of the wafer holding member 1.

However, in wafer holding member 1 according to the present invention, cavity portion 5 forms a heat insulation structure, which tends to prevent significant degradation of the flatness and the parallelism of the wafer placing surface of wafer holding member 1. Further, wafer holding member 1 according to the present invention employs hollow supporting member 4 having cavity portion 5, which can reduce the weight, in comparison with the case of employing a solid supporting member with a circular cylindrical shape. Also, in the case of installing at least a portion of the cooling mechanism on the surface of chuck top 2 facing to supporting member 4, it is possible to install at least a portion of the cooling mechanism on the surface of chuck top 2 opposite from the surface thereof on which heating member 6 is installed.

Figure 4:
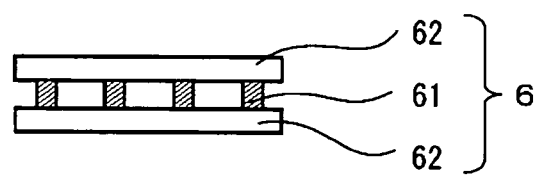
FIG. 4 is a schematic cross-sectional view of an exemplary heating member according to the present invention.

FIG. 4 illustrates a schematic cross-sectional view of an exemplary heating member for use in the present invention. In this case, a heating member 6 is constituted by insulation members 62 and a resistance heat-generating member 61 sandwiched therebetween. As resistance heat-generating member 61, it is possible to employ a metal foil made of a metal such as nickel, stainless steel, silver, tungsten, molybdenum, chromium or an alloy made of two of them.

Among them, it is possible to employ stainless steel and nichrome, as the metal used in resistance heat-generating member 61. The use of stainless steel or nichrome tends to enable formation of circuit patterns of the resistance heat-generating member with relatively higher accuracy through etching or other methods, in processing it into the shape of the heat generating member. Furthermore, stainless steel and nichrome are inexpensive and have resistance to oxidation and, therefore, tend to withstand long-time utilization even at high temperatures.

Further, there is no particular limitation on insulation members 62, provided that they have heat resistance. For example, it is possible to employ mica, a silicon resin, an epoxy resin or a phenol resin or the like.

Also, as shown in FIG. 4, in the case of using heating member 6 constituted by insulation members 62 made of an insulation resin and resistance heat-generating member 61 sandwiched therebetween, it is possible to disperse filler into the insulation resin constituting insulation members 62, in order to enable smoothly transferring heat generated from resistance heat-generating member 61 to chuck top 2. Such filler functions to enhance the heat transfer in the insulation resin such as a silicon resin. There is no particular limitation on the material of such filler, provided that it is not reactive to the insulation resin constituting insulation members 62, and it is possible to employ, for example, boron nitride, aluminum nitride, alumina, silica and the like. Further, heating member 6 can be secured to the portion to which heating member 6 is to be mounted (for example, the surface of a coating member 9 and the like) through a mechanical method such as using screws.

Further, it is preferable that supporting member 4 has a Young's modulus of 200 GPa or higher. If supporting member 4 has a Young's modulus less than 200 GPa, this will make it impossible to make the thickness of the bottom portion of supporting member 4 smaller, which makes it impossible to ensure a sufficient volume of cavity portion 5, thereby making it impossible to provide sufficient heat insulating effects of cavity portion 5. If supporting member 4 has a Young's modulus less than 200 GPa, this may make it impossible to ensure a space for installing the cooling mechanism in cavity portion 5. It is more preferable that supporting member 4 has a Young's modulus of 300 GPa or more. When supporting member 4 is made of a material having a Young's modulus of 300 GPa or more, it is possible to significantly suppress the deformation of supporting member 4, which enables reduction of the size and the weight of supporting member 4. Accordingly, the use of such a material is particularly preferable.

Further, it is preferable that supporting member 4 has a heat conductivity of 40 W/mK or less. If supporting member 4 has a heat conductivity greater than 40 W/mK, this may cause heat transferred to chuck top 2 to easily transfer to supporting member 4, which may affect the accuracy of the driving system. In recent years, there has been a need for heating semiconductor wafers to high temperatures in the range of 150 to 200° C. during probing thereof and, therefore, it is preferable that supporting member 4 has a heat conductivity of 10 W/mK or less, in order to prevent heat transfer to the driving system. Further, it is more preferable that supporting member 4 has a heat conductivity of 5 W/mK or less. This is because, when supporting member 4 has a heat conductivity of 5 W/mK or less, it tends to significantly reduce the amount of heat transferred from supporting member 4 to the driving system.

It is preferable to employ mullite, alumina or a composite of mullite and alumina (mullite-alumina composite), as the material of supporting member 4 which satisfies the aforementioned condition on the heat conductivity. Mullite is preferable in that it has a lower heat conductivity and higher heat-insulating effects, while alumina is preferable in that it has a higher Young's modulus and greater rigidity. Mullite-alumina composites are totally preferable in that they have heat conductivities lower than alumina and Young's modulus higher than mullite.

Further, it is preferable that side portion 4b of supporting member 4 has a thickness of 20 mm or less. If side portion 4b of supporting member 4 has a thickness greater than 20 mm, this may increase the amount of heat transferred from chuck top 2 to supporting member 4. Further, in view of reducing the amount of heat transferred from chuck top 2 to supporting member 4, it is preferable that side portion 4b of supporting member 4 for supporting chuck top 2 has a thickness of 10 mm or less. However, if the thickness thereof is smaller than 1 mm, this may cause deformation and fractures of side portion 4b of supporting member 4 during probing of a semiconductor wafer, due to the pressure of a probe card which is pressed thereto. From the aforementioned viewpoints, it is preferable that side portion 4b of supporting member 4 has a thickness in the range of 1 mm to 10 mm. Further, it is preferable that the portion of side portion 4b of supporting member 4 that contacts with chuck top 2 has a thickness in the range of 2 mm to 5 mm. When the thickness thereof falls in the range of 2 mm to 5 mm, there is a tendency to realize a preferable balance between the strength and the heat insulating characteristic of supporting member 4.

Further, it is preferable that the height of side portion 4b of supporting member 4 (height of supporting member 4 except the thickness of bottom portion 4a of supporting member 4) is equal to or greater than 10 mm. If side portion 4b of supporting member 4 has a height less than 10 mm, this will cause the pressure from the probe card to be applied to chuck top 2 and further to be transferred to supporting member 4, during probing, which may cause deflection of bottom portion 4a of supporting member 4, thereby causing degradation of the flatness of the wafer placing surface.

Further, it is preferable that bottom portion 4a of supporting member 4 has a thickness of 10 mm or more. If bottom portion 4a of supporting member 4 has a thickness less than 10 mm, this will cause the pressure from the probe card to be applied to chuck top 2 and further to be transferred to supporting member 4, during probing, which may cause deflection of bottom portion 4a of supporting member 4, thereby causing degradation of the flatness of the wafer placing surface.

Further, it is preferable that bottom portion 4a of supporting member 4 has a thickness in the range of 10 mm to 35 mm. If bottom portion 4a of supporting member 4 has a thickness smaller than 10 mm, in addition to the aforementioned problem, heat from chuck top 2 can be easily transferred to bottom portion 4a of supporting member 4, which may cause warpage of supporting member 4 due to its thermal expansion, thereby degrading the flatness and the parallelism of the wafer placing surface. Further, when bottom portion 4a of supporting member 4 has a thickness of 35 mm or less, it is possible to reduce of the size of the wafer holding member 1 according to the present invention and, therefore, such a thickness value is preferable.

Also, supporting member 4 can be configured such that bottom portion 4a and side portion 4b thereof are separated from each other, instead of integrating them with each other. In this case, a boundary is formed between bottom portion 4a and side portion 4b separated from each other, and this boundary forms a heat resistance layer which shields the heat transferred from chuck top 2 to supporting member 4, which may tend to suppress the increase of the temperature of bottom portion 4a of supporting member 4.

Further, it is preferable to provide a heat-insulating configuration on the supporting surface of supporting member 4 that supports chuck top 2 (surface of side portion 4b of supporting member 4 that contacts with chuck top 2). In this case, for example, such a heat-insulating configuration can be fabricated by cutting away a portion of the supporting surface of supporting member 4 to form grooves. The grooves reduce the contact area between chuck top 2 and supporting member 4, thereby providing a heat-shielding configuration.

Further, in the case of forming grooves in the supporting surface of supporting member 4, it is preferable that chuck top 2 has a Young's modulus of 250 GPa or more. During probing, the pressure of the probe card is applied to chuck top 2 and, therefore, in the case where the supporting surface of supporting member 4 has grooves, if chuck top 2 is made of a material having a smaller Young's modulus, this will cause significant deformation of chuck top 2. If significant deformation of chuck top 2 occurs, this may cause fractures of the semiconductor wafer and fractures of chuck top 2.

Figure 5:
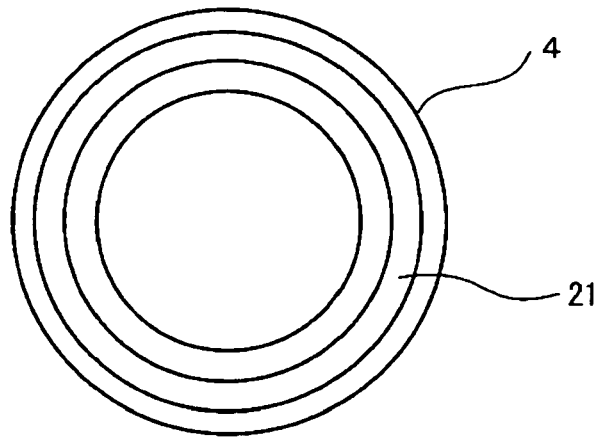
FIG. 5 is a schematic plan view of an exemplary heat-insulation configuration in the wafer holding member according to the present invention.
Figure 6:
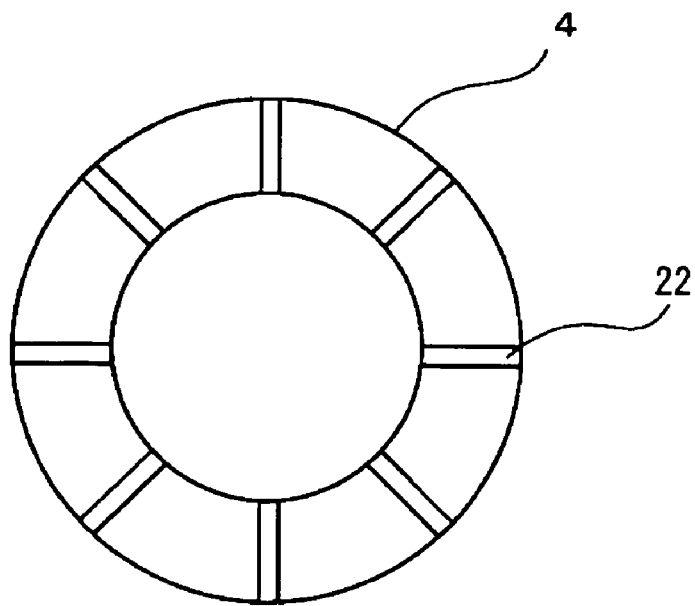
FIG. 6 is a schematic plan view of another exemplary heat-insulation configuration in the wafer holding member according to the present invention.

Further, as grooves formed in the supporting surface of supporting member 4, it is possible to employ, for example, concentric grooves 21 as illustrated in FIG. 5, radial grooves 22 as illustrated in FIG. 6, grooves with a plurality of protrusions or reed-shaped grooves. Although there is no particular limitation on the shape of grooves, it is preferable to form grooves having symmetric shapes. If the grooves have asymmetric shapes, the pressure acting on chuck top 2 can not be uniformly dispersed, which may affect the deformation and fractures of chuck top 2.

Figure 7:
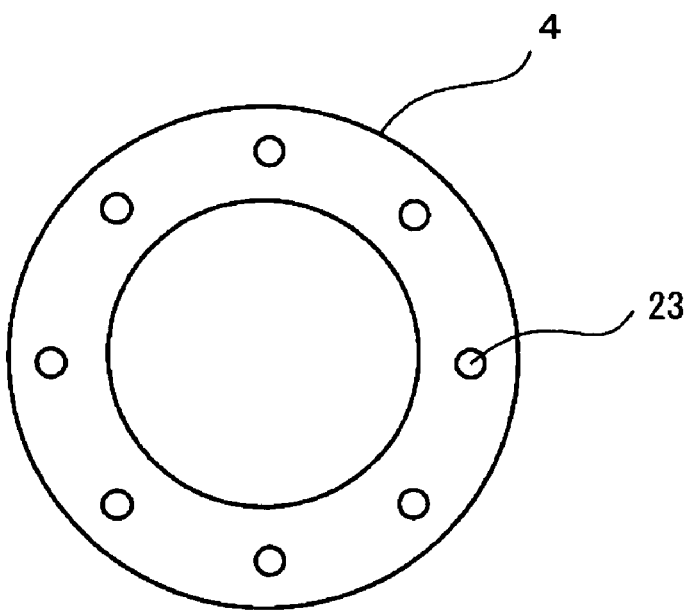
FIG. 7 is a schematic plan view of another exemplary heat-insulation configuration in the wafer holding member according to the present invention.

As the heat-insulation configuration provided in the supporting surface of supporting member 4 that supports chuck top 2, it is possible to install, for example, a plurality of column-shaped members 23 on the supporting surface of supporting member 4, as illustrated in FIG. 7. In this case, it is preferable that the placement of the column-shaped members 23 is equal or similar to a concentric placement and also the number of the column shaped members 23 is equal to or more than 8. In recent years, semiconductor wafers have been increased in size to 8 to 12 inches and, if the number of column-shaped members 23 is less than 8, this will increase the distance between adjacent column-shaped members 23, which may cause deflection of chuck top 2 between column-shaped members 23, when the probe pins of a probe card is pressed against a semiconductor wafer placed on chuck top 2. Further, it is possible to form two boundaries, which are the boundary between chuck top 2 and column-shaped members 23 and the boundary between column-shaped members 23 and supporting member 4. These boundaries form heat-resistance layers and, thus, there are provided double heat-resistance layers, which can effectively shield the transfer of heat generated from chuck top 2 to supporting member 4.

Further, there is no particular limitation on the shape of column-shaped members 23 and, it is possible to employ, for example, a circular cylindrical shape, a triangular shape, a rectangular shape, a pipe shape or other polygonal shapes. By interposing column-shaped members 23 between chuck top 2 and supporting member 4 as described above, it is possible to effectively prevent heat from being transferred from chuck top 2 to supporting member 4.

Further, as the material of column-shaped members 23, it is possible to employ, for example, silicon nitride, mullite, mullite-alumina composites, steatite, cordierite, stainless steels, glass, heat-resistant resins such as a polyimide resin, an epoxy resin or a phenol resin, or composites of them.

Further, it is preferable to employ a material having a heat conductivity of 30 W/mK or less, as the material of column-shaped members 23. If the material of column-shaped members 23 has a heat conductivity greater than 30 W/mK, this may degrade the effect of preventing the heat transfer from chuck top 2 to supporting member 4.

In the case where supporting member 4 is in contact with chuck top 2, it is preferable that at least one of the contact surface of supporting member 4 and the contact surface of chuck top 2 at the contact portion has a surface roughness Ra of 0.1 µm or more. Also, in the case where supporting member 4 is in contact with chuck top 2 with column-shaped members 23 interposed therebetween, it is preferable that at least one of the contact surface of supporting member 4, the contact surfaces of column-shaped members 23 and the contact surface of chuck top 2 at the contact portion has a surface roughness Ra of 0.1 µm or more. If the surface roughness Ra is less than 0.1 µm, this will make the contact area at the aforementioned contact portion greater and also make the gap at the contact portion relatively smaller, thereby tending to increase the amount of heat transferred therebetween, in comparison with cases where the surface roughness Ra is 0.1 µm or more.

Although there is no upper limit of the aforementioned surface roughness, if the surface roughness Ra is equal to or greater than 5 µm, this will increase the cost for processing the surface. As a method for making the surface roughness Ra equal to or greater than 0.1 µm, it is possible to employ, for example, polishing and sandblasting. In this case, there is a need for properly setting the condition of polishing or sand blasting to control the aforementioned surface roughness Ra to be equal to or greater than 0.1 µm. Here, the surface roughness Ra refers to a calculated average roughness Ra defined by JIS B 0601.

Further, it is preferable that bottom portion 4a of supporting member 4 has a surface roughness Ra of 0.1 μm or more. By making the surface roughness Ra of bottom portion 4a of supporting member 4 greater as described above, it is possible to reduce the amount of heat transferred to the driving system.

When bottom portion 4a and side portion 4b of supporting member 4 can be separated from each other, it is preferable that at least one of the contact surface of bottom portion 4a and the contact surface of the cylindrical portion, at the portion where bottom portion 4a and side portion 4b of supporting member 4 contacts with each other, has a surface roughness Ra of 0.1 μm or more. If the surface roughness Ra is less than 0.1 μm, this may degrade the effect of shielding the heat transferred from side portion 4b of supporting member 4 to bottom portion 4a thereof.

By forming contact portions between components constituting the wafer holding member and making the surface roughness Ra of the contact surfaces constituting the contact portions equal to or greater than 0.1 μm, as described above, it is possible to reduce the amount of heat transferred to bottom portion 4a of supporting member 4, thus resulting in reduction of the amount of electricity supplied to the heat generating member.

Further, it is preferable that the squareness between the outer peripheral portion of side portion 4b of supporting member 4 and the surface of supporting member 4 that contacts with chuck top 2 or the squareness between the outer peripheral portion of side portion 4b of supporting member 4 and the surfaces of column-shaped members 23 that contact with chuck top 2 is equal to or less than 10 mm, which is a value converted with respect to a measurement length of 100 mm. For example, if the squareness exceeds 10 mm, side portion 4b of supporting member 4 is prone to deformation, when the pressure from chuck top 2 acts on side portion 4b of supporting member 4.

Further, it is preferable that a metal layer is formed on the surface of supporting member 4. Electric fields and electromagnetic waves generated from the heat generating member for heating chuck top 2, the driving system and peripheral apparatuses may induce noises during probing and such noises may affect the probing. Therefore, when a metal layer is formed on the surface of supporting member 4, there is a tendency to shield such noises. Further, there is no particular limitation on the method for forming the metal layer, and it is possible to apply, using a brush, a conductor paste consisting of a metal powder made of silver, gold, nickel or copper and a glass frit added thereto and then bake it.

Also, such a metal layer can be formed by thermally spraying metal such as aluminum or nickel. Also, such a metal layer can be formed by applying metal plating to the surface of supporting member 4. Further, such a metal layer can be formed through a combination of these methods. Namely, a metal layer can be formed either by baking a conductor paste and then plating a metal such as nickel thereon or by thermally spraying a metal and then plating a metal thereon. Particularly, it is preferable to form a metal layer by plating or thermally spraying a metal. The use of plating tends to increase the reliability of the metal layer, since it can offer higher adhesion strength thereof. Also, the use of thermally spraying tends to enable formation of a metal layer with a relatively lower cost.

Further, as another method for shielding noises, it is possible to employ a method of mounting a ring-shaped conductor to the outer peripheral surface of side portion 4b of supporting member 4. For example, a metal foil can be shaped into a ring shape with a size greater than the outer diameter of supporting member 4 and the ring-shaped metal foil can be mounted to the outer peripheral surface of side portion 4b of supporting member 4. Also, a metal foil or a metal plate can be mounted to the bottom surface of supporting member 4 (back surface of bottom portion 4a) and the metal foil or metal plate can be connected to the metal foil mounted to the outer peripheral surface of side portion 4b of supporting member 4 to enhance the effect of shielding electromagnetic waves (guard effect). Also, by using cavity portion 5 inside of supporting member 4, a metal foil or a metal plate can be mounted within cavity portion 5 and can be connected to the metal foils mounted to the outer peripheral surface of side portion 4b of supporting member 4 and the bottom surface thereof to enhance the guard effect. By employing the aforementioned methods, it is possible to provide guard effects with relatively lower cost, in comparison with cases of plating or applying a conductor paste. There is no particular limitation on the method for securing such a metal foil or a metal plate to supporting member 4 and, for example, a metal foil or a metal plate can be secured to supporting member 4 through metal screws. Also, it is preferable to integrate the metal foils or the metal plates on the bottom surface and the side surface of supporting member 4 with each other.

Figure 8:
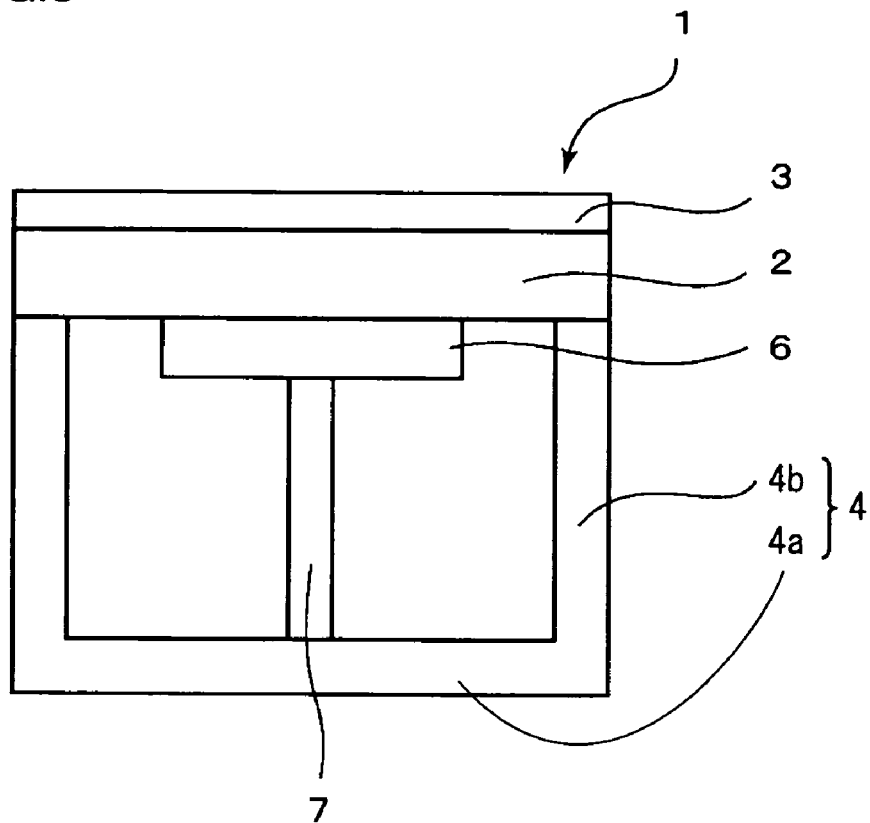
FIG. 8 is a schematic cross-sectional view of another exemplary wafer holding member according to the present invention.

FIG. 8 illustrates a schematic cross-sectional view of another exemplary wafer holding member according to the present invention. In this case, a wafer holding member 1 according to the present invention is characterized in that a supporting rod 7 is provided near the center portion of the cavity portion 5 inside a supporting member 4 and also a heating member 6 is provided at the tip end portion of supporting rod 7. With the aforementioned configuration, it is possible to suppress the deformation of a chuck top 2 through supporting rod 7, when a probe card is pressed against chuck top 2 during probing. In FIG. 8, illustration of the cooling mechanism is omitted.

It is preferable that supporting rod 7 is made of a material of the same type as the material of supporting member 4. Supporting member 4 and supporting rod 7 thermally expand, since they receive heat from heating member 6 for heating chuck top 2. In this case, if supporting member 4 and supporting rod 7 are made of different materials, this will cause a level difference between supporting member 4 and supporting rod 7 due to the difference in the thermal expansion coefficient therebetween, which tends to cause deformation of chuck top 2.

Although there is no particular limitation on the size of supporting rod 7, it is preferable that supporting rod 7 has a cross-sectional area of 0.1 cm² or more. If supporting rod 7 has a cross-sectional area less than 0.1 cm², it is impossible to offer sufficient supporting effects, which tends to cause deformation of supporting rod 7.

Further, it is preferable that supporting rod 7 has a cross-sectional area of 100 cm² or less. If supporting rod 7 has a cross-sectional area greater than 100 cm², heat can easily transfer from chuck top 2 to bottom portion 4a of supporting member 4, which is prone to increase the temperature of bottom portion 4a of supporting member 4.

There is no particular limitation on the shape of supporting rod 7, and it may be, for example, a circular cylindrical shape, a triangular cylindrical shape, a rectangular cylindrical shape, a pipe shape or the like. There is also no particular limitation on the method for securing supporting rod 7 to supporting member 4, and it is possible to employ, for example, soldering using an active metal soldering material, securing using glass or securing using screws. Among them, securing using screws is particularly preferable. Securing using screws enables easily attaching and detaching supporting member 4 and supporting rod 7 to and from each other and also eliminates the necessity of performing thermal treatment in securing them, which can suppress the thermal deformation of supporting member 4 and supporting rod 7.

Further, it is preferable to form an electromagnetic shield electrode layer for shielding electromagnetic waves, between heating member 6 and chuck top 2. The electromagnetic shield electrode layer functions to shield noises caused by electromagnetic waves and electric fields generated from heating member 6, wherein such noises affect the probing of a semiconductor wafer. Such noises will not significantly affect usual measurement of electric characteristics of semiconductor wafers, but will significantly affect measurement of high-frequency characteristics of semiconductor wafers. The electromagnetic shield electrode layer can be formed by inserting a metal foil between heating member 6 and chuck top 2, wherein chuck top 2 and heating member 6 are insulated with each other. Although there is no particular limitation on the material of the metal foil used in the electromagnetic shield electrode layer, it is preferable to employ stainless steel, nickel or aluminum, since the temperature of heating member 6 reaches about 200° C.

An on-electric-circuit condenser is formed between chuck top 2 and chuck-top conductive layer 3 when chuck top 2 is made of an insulating material, while it is formed between chuck top 2 and the electromagnetic shield electrode layer when chuck top 2 is made of a conductor. During probing of a semiconductor wafer, the on-electric-circuit condenser may affect the probing as noises. Accordingly, an insulating layer can be formed between the electromagnetic shield electrode layer and chuck top 2 to alleviate the influences of such noises.

Further, it is preferable to form a guard electrode layer between chuck top 2 and the electromagnetic shield electrode layer, with insulating layers interposed therebetween. The guard electrode layer can be electrically connected to the metal layer formed on supporting member 4 to further reduce noises which would affect measurement of high-frequency characteristics of a semiconductor wafer.

Namely, in the present invention, the supporting member 4 containing heating member 6 inside thereof can be entirely covered with a conductor to reduce noises which would affect measurement of high-frequency characteristics of a semiconductor wafer. Further, the guard electrode layer can be electrically connected to the metal layer provided on supporting member 4 to further reduce the influences of noises.

In this case, it is preferable that the insulation layers between heating member 6 and the electromagnetic shield electrode layer, between the electromagnetic shield electrode layer and the guard electrode layer and between the guard electrode layer and chuck top 2 have resistance values of $10^7 \Omega$ or more. If the resistance values are less than $10^7 \Omega$, a small electric current will flow toward chuck-top conductive layer 3 due to the influences of heating member 6, which may cause noises during probing, thereby affecting the probing. When the insulating layers have resistance values of $10^7 \Omega$ or more, the aforementioned small electric current can be reduced without affecting probing. Therefore, such resistance values of the insulating layers are preferable.

Particularly, in recent years, miniaturization of circuit patterns formed on semiconductor wafers has been advanced, and there is a need for reducing noises as aforementioned as much as possible. By setting the resistance values of the insulating layers to equal to or higher than $10^{10} \Omega$, it is possible to form a configuration with higher reliability.

Further, it is preferable that the insulating layers have permittivity of 10 or less. If the permittivity of the insulating layers exceeds 10, the electromagnetic shield electrode layer, the guard electrode layer and chuck top 2 are prone to accumulate electric charges, thereby causing noises.

Further, the insulating layers preferably have permittivity of 4 or less and more preferably have permittivity of 2 or less. By setting the permittivity smaller, it is possible to alleviate the occurrence of noises as aforementioned and, also, it is possible to reduce the thickness of the insulating layers required for ensuring their insulating resistance values and electrostatic capacities, thereby reducing the heat resistances of the insulating layers.

Further, when chuck top 2 is made of an insulating material, it is preferable that the electrostatic capacities between chuck-top conductive layer 3 and the guard electrode layer and between chuck-top conductive layer 3 and the electromagnetic shield electrode layer are 5000 pF or less. When chuck top 2 is made of a conductor, it is preferable that the electrostatic capacities between chuck top 2 and the guard electrode layer and between chuck top 2 and the electromagnetic shield electrode layer are 5000 pF or less. If the electrostatic capacities exceed 5000 pF, this will increase the influences of the insulating layers as condensers, which, during probing, may affect the probing as noises. In consideration of the miniaturization of circuit patterns formed on semiconductor wafers in recent years, it is preferable that the aforementioned electrostatic capacities are equal to or less than 1000 pF, in view of realization of preferable probing.

By controlling the resistance values, the permittivity and the electrostatic capacities of the insulating layers to within the aforementioned ranges, as described above, it is possible to significantly reduce noises which would affect probing. It is preferable that the insulating layers have thickness equal to or greater than 0.2 mm. While it is preferable that the insulating layers have smaller thickness in order to reduce the size of the apparatus and maintain preferable heat transfer from heating member 6 to chuck top 2, if the insulating layers have thickness of 0.2 mm or less, this may cause defects of the insulating layers themselves and the problem of durability. Further, it is preferable that the insulating layers have thickness equal to or greater than 1 mm. When the insulating layers have thickness equal to or greater than 1 mm, it is possible to alleviate the problem of the durability of the insulating layers, and there is a tendency to realize preferable heat transfer from heating member 6.

It is preferable that the insulating layers have thickness of 10 mm or less. If the insulating layers have thickness greater than 10 mm, they will have excellent noise-shielding effects, while a longer time will be required to transfer heat generated from heating member 6 to chuck top 2 and the semiconductor wafer thereon, which may increase the difficulty of controlling the temperature at which the semiconductor is heated. Further, it is more preferable that the insulating layers have thickness of 5 mm or less. When the insulating layers have thickness of 5 mm or less, it is possible to perform temperature control relatively easily, although depending on the probing condition.

Although there is no particular limitation on the heat conductivities of the insulating layers, it is preferable that their heat conductivities are equal to or greater than 0.5 W/mK, in order to realize preferable heat transfer from heating member 6. Further, when the insulting layers have heat conductivities of 1 W/mK or more, there is a tendency to realize more preferable heat transfer.

There is no particular limitation on the material of the insulating layers, provided that the material has heat resistance enough to withstand probing temperatures, and it is possible to employ a ceramic or a resin. As such a resin for use in the insulating layers, it is possible to a silicon resin, a silicon resin containing filler dispersed therein, a ceramic such as alumina. The filler functions to enhance the heat transfer in the resin, which is a silicon resin or the like, used in the insulating layers, and there is no particular limitation on the material of the filler, provided that it is not reactive to the resin used in the insulating layers. For example, it is possible to employ boron nitride, aluminum nitride, alumina, silica and other materials.

Further, it is preferable that the region at which the insulating layers are formed is equal to or greater than the regions at which the electromagnetic shield electrode layer, the guard electrode or the heating member is formed. If the region at which the insulation layers are formed is smaller, this may cause noises to intrude through portions which are not covered with the insulating layers.

Hereinafter, the insulating layers will be described using an example thereof. For example, a silicon resin containing boron nitrogen dispersed therein is employed as insulating layers. The insulating layers have a permittivity of 2. In the case of interposing a silicon resin containing boron nitride dispersed therein as insulating layers between the electromagnetic shield electrode layer and the guard electrode layer and between the guard electrode layer and chuck top 2, if chuck top 2 has an aperture adaptable to a 12-inch semiconductor wafer, it is possible to form the insulating layers to have a diameter of, for example, 300 mm.

In this case, when the insulating layers have a thickness of 0.25 mm, they have an electrostatic capacity of 5000 pF. Also, when the insulating layers have a thickness of 1.25 mm, they have an electrostatic capacity of 1000 pF.

In the case where the insulating layers have a diameter of 300 mm, when the insulating layers are made to have thickness of 0.8 mm or more, the insulating layers have resistances of about 1E12 ohm, since the insulating layers have a volume resistivity of 9E15 ohm*cm. Further, since the insulating layers have heat conductivities of about 5 W/mK, the thickness of the insulating layers can be selected depending on the probing condition and, when the thickness of the insulating layers are set to 1.25 mm or more, it is possible to set the electrostatic capacities and the resistance of the insulating layers to sufficient values.

Figure 9:
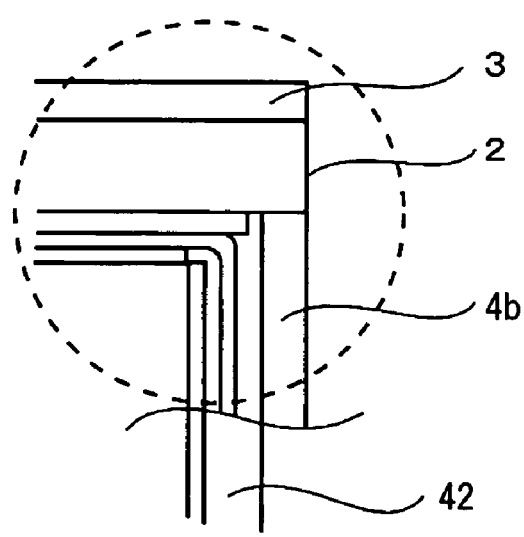
FIG. 9 is a schematic enlarged cross-sectional view of a portion of the wafer holding member illustrated in FIG. 10.

FIG. 9 illustrates a schematic enlarged cross-sectional view of a portion of the wafer holding member illustrated in FIG. 8. As illustrated in FIG. 9, it is preferable that, through side portion 4b of supporting member 4 of the wafer holding member according to the present invention, there is formed a through hole 42 for inserting, therethrough, a heater electrode and the electromagnetic shield electrode layer for supplying electricity to heating member 6. In this case, it is preferable that through hole 42 is formed near the center portion of side portion 4b of supporting member 4. If through hole 42 is formed near the outer peripheral portion of side portion 4b, this will degrade the strength of supporting member 4 supported at its side portion 4b due to the influences of the pressure of the probe card, which may cause deformation of supporting member 4 near through hole 42. In the drawings other than FIG. 9, illustration of the electrode and the through hole is omitted.

If the wafer placing surface (surface of chuck-top conductive layer 3 opposite from the surface thereof that is in contact with chuck top 2) has warpage greater than 30 μm, the probe pins of a probe card are non-uniformly butted thereagainst during probing, which may make it impossible to evaluate electric characteristics of a semiconductor wafer or may cause measurement failures due to the poor contact therebetween. This may cause the semiconductor wafer to be evaluated as worse needlessly, thereby degrading the yield. Accordingly, such warpage is not preferable.

Further, if the parallelism between the wafer placing surface and the bottom surface of supporting member 4 is greater than 30 μm, similarly, this will cause poor contact. Accordingly, such a greater parallelism is not preferable. Even when the warpage of the wafer placing surface and the parallelism between the wafer placing surface and the bottom surface of supporting member 4 are equal to or less than 30 μm and thus are preferable at the room temperature, if the warpage of the wafer placing surface and the parallelism of the wafer placing surface become greater than 30 μm during probing of a semiconductor wafer heated to 200° C., this will not be preferable. The same also applies to cases where a semiconductor wafer is probed at a temperature of −70° C. Namely, it is preferable that the warpage of the wafer placing surface and the parallelism between the wafer placing surface and the bottom surface of supporting member 4 are both equal to or less than 30 μm, over the entire probing temperature range (for example, in the range of −70 to 200° C.).

On the surface of chuck top 2, there is formed chuck-top conductive layer 3. Chuck-top conductive layer 3 is formed in order to provide the function of protecting chuck top 2 from corrosive gases, acids, alkali liquids, organic solvents and water and the like which are usually used for the fabrication of semiconductor wafers and the function of establishing a ground between chuck top 2 and the semiconductor wafer placed on chuck top 2, in order to shield noises from the portion lower than chuck top 2.

There is no particular limitation on the method for forming chuck-top conductive layer 3, and it is possible to employ a method of applying a conductive paste through screen printing and then baking it, a vapor deposition method, a sputtering method, a thermally spraying method, a plating method or other methods.

Among them, it is preferable to employ thermally spraying or plating, as a method of forming chuck-top conductive layer 3. The use of these methods requires no heat treatment in forming chuck-top conductive layer 3 thereby preventing the occurrence of warpage of chuck top 2 due to heat treatment and also requires relatively lower cost thereby enabling the formation of an inexpensive chuck-top conductive layer 3 having excellent characteristics.

It is particularly preferable that chuck-top conductive layer 3 is formed by forming a thermal sprayed film on chuck top 2 through thermally spraying and then forming a plated film on the thermal sprayed film through plating. The thermal sprayed film formed through thermally spraying is excellent in adhesion to ceramics or metal-ceramic composites, in comparison with the plated film formed through plating. This is because the material to be thermal sprayed, which is aluminum, nickel or the like, forms some amount of an oxide, a nitride or an oxynitride, during thermally spraying. Then, the formed compound reacts with the surface of chuck top 2 and thus adheres thereto firmly.

However, such a compound contained in the thermal sprayed film reduces the conductivity of the thermal sprayed film. On the contrary, the plated film can be made of substantially a pure metal, which enables formation of chuck-top conductive layer 3 with a higher conductivity, while having strength of adhesion to chuck top 2 lower than the thermal sprayed film. Accordingly, when a thermal sprayed film is formed as an under layer and then a plated film is formed thereon, the plated layer has preferable strength of adhesion to the thermal sprayed film since the thermal sprayed film is made of a metal and further exhibits a higher electric conductivity.

Further, it is preferable that chuck-top conductive layer 3 on chuck top 2 has a surface roughness Ra of 0.5 μm or less. If the surface roughness Ra exceeds 0.5 μm, in the case of measuring electric characteristics of a semiconductor wafer which generates a greater amount of heat, it is impossible to release, through chuck top 2, heat caused by the self heating of the semiconductor wafer itself during probing, which may raise the temperature of the semiconductor wafer, thereby resulting in thermal fractures thereof. When chuck-top conductive layer 3 has a surface roughness Ra of 0.02 μm or less, it is possible to efficiently release heat therefrom. Accordingly, such surface roughness Ra is preferable.

When probing of a semiconductor wafer is conducted at, for example, 200° C., by heating a heat generating member installed on chuck top 2, it is preferable that the temperature of the bottom surface of supporting member 4 is maintained at 100° C. or less. If the temperature of the bottom surface of supporting member 4 exceeds 100° C., this will cause distortions in the driving system provided below supporting member 4, due to the difference in the thermal expansion coefficient, to degrade the accuracy of the driving system, which causes malfunctions such as positional deviations during probing, non-uniform contact of probe pins due to the warpage of the semiconductor wafer and degradation of the parallelism thereof, thereby making it impossible to perform accurate inspection on the semiconductor wafer. Furthermore, in the case of performing measurement on the semiconductor wafer at the room temperature after performing measurement of characteristics of the semiconductor wafer at 200° C., it will take a longer time to cool down the semiconductor wafer from 200° C. to the room temperature, thereby degrading the throughput.

Further, it is preferable that chuck top 2 has a Young's modulus of 250 GPa or more. If chuck top 2 has a Young's modulus less than 250 GPa, this will cause deflection in chuck top 2 due to forces that act on chuck top 2 during probing, thereby significantly degrading the flatness and the parallelism of the wafer placing surface. Accordingly, in view of the aforementioned circumstances, chuck top 2 preferably has a Young's modulus of 250 or more and more preferably has a Young's modulus of 300 GPa or more.

Further, it is preferable that chuck top 2 has a heat conductivity of 15 W/mk or more. If chuck top 2 has a heat conductivity less than 15 W/mk, this may degrade the uniformity of the temperature distribution over the semiconductor wafer placed on chuck top 2. Accordingly, when chuck top 2 has a heat conductivity of 15 W/mk or more, it is possible to realize uniformity enough not to interfere with probing. As the material of chuck top 2 having such a heat conductivity, it is possible to employ, for example, an alumina with a purity of 99.5% (with a heat conductivity of 30 W/mK).

Further, it is preferable that chuck top 2 has a heat conductivity of 170 W/mk or more. As the material of chuck top 2 having such a heat conductivity, it is possible to employ, for example, aluminum nitride (170 W/mK), composites of silicon and silicon carbide (170 W/mK to 220 W/mK). When chuck top 2 has a heat conductivity of 170 W/mK or more, chuck top 2 can exhibit an excellent heat uniformizing characteristic.

Further, it is preferable that chuck top 2 has a thickness of 8 mm or more. If chuck top has a thickness less than 8 mm, this will cause deflection of chuck top 2, due to forces that act on chuck top 2 during probing, to significantly degrade the flatness and the parallelism of the wafer placing surface, which may make it impossible to perform accurate inspections of electric characteristics of a semiconductor wafer due to poor contact of probe pins and may cause fractures of the semiconductor wafer. In view of the aforementioned circumstances, chuck top 2 has a thickness of 8 mm or more and more preferably has a thickness of 10 mm or more.

As the material of chuck top 2, it is possible to employ, for example, a metal-ceramic composite, a ceramic or a metal. In this case, it is preferable to employ, as a metal-ceramic composite, a composite of aluminum and silicon carbide, a composite of silicon and silicon carbide or a composite of aluminum, silicon and silicon carbide which have relatively higher conductivities and thus offer uniform heat distributions during heating a semiconductor wafer. Further, it is particularly preferable to employ a composite of silicon and silicon carbide as the material of chuck top 2, since such a composite of silicon and silicon carbide has a particularly higher Young's modulus and a higher heat conductivity.

Further, these composites have conductivity and, therefore, when a heat generating member is formed on chuck top 2, for example, the heat generating member can be formed by forming an insulating layer on the surface of chuck top 2 opposite from the wafer placing surface through thermally spraying or screen printing and then forming a conductive layer on the insulating layer through screen printing or by forming a conductive layer with a predetermined pattern through a vapor deposition method or the like.

Further, a heat generating member can be formed by applying etching to a metal foil made of stainless steel, nickel, silver, molybdenum, tungsten, chromium or an alloy of them to form a predetermined heat-generating member pattern. In this method, the heat generating member can be insulated from chuck top 2 by forming an insulating layer as previously described and also by inserting, for example, an insulating sheet between chuck top 2 and the heat generating member. The latter case is preferable since it enables forming an insulating layer easily with significantly lower cost, in comparison with the aforementioned method. As an insulating sheet usable in this case, there are a mica sheet or a resin sheet made of an epoxy resin, a polyimide resin, a phenol resin, a silicon resin or the like, in view of the heat resistance. This is because mica sheets have excellent heat resistances, excellent electric insulating characteristics and excellent workability and also are inexpensive.

Further, ceramics can be used as the material of chuck top 2 relatively easily, since the use of ceramics can eliminate the necessity of forming an insulating layer as described above. Further, in this case, the heat generating member can be formed through the same methods as those previously described. Among ceramic materials usable as the material of chuck top 2, it is particularly preferable to employ alumina, aluminum nitride, silicon nitride, mullite, a composite of alumina and mullite. These materials are particularly preferable, since they have relatively higher Young's modulus and can suppress the deformation of chuck top 2 due to the pressing of a probe card thereagainst.

Among them, alumina is relatively inexpensive and exhibits excellent electric characteristics at higher temperatures and, thus, is most suitable as the material of chuck top 2. In view of increasing the insulating characteristic at higher temperatures, alumina with a purity of 99.6% or more is preferable and alumina with a purity of 99.9% or more is more preferable. In general, silicon oxides or oxides of alkaline-earth metals are added to alumina in sintering it in order to reduce the sintering temperature, and such added oxides degrade electric characteristics, such as the electric insulating characteristic, of alumina at higher temperatures. Accordingly, alumina with a purity of 99.6% or more is preferable and alumina with a purity of 99.9% or more is more preferable.

Also, metals can be used as the material of chuck top 2. As metals usable as the material of chuck top 2, it is possible to employ tungsten, molybdenum and an alloy of them which have higher Young's modulus. As such an alloy, concretely, it is possible to employ, for example, an alloy made of tungsten and copper or an alloy made of molybdenum and copper. These alloys can be formed by impregnating tungsten or molybdenum with copper. These metals are also conductors similarly to the aforementioned ceramic-metal composite and, therefore, chuck-top conductive layer 3 and the heat generating member can be formed thereon by employing the aforementioned methods.

It is preferable that the wafer placing surface exhibits warpage of 30 μM or less when a force of 3.1 MPa is applied to the surface of the wafer placing surface. During probing, a plurality of probe pins for inspections for electric characteristics of a semiconductor wafer are pressed against a semiconductor wafer and, therefore, the pressure thereof affects chuck-top conductive layer 3, which causes not a little warpage of the wafer placing surface. If the warpage of the wafer placing surface exceeds 30 μm at this time, this will prevent the probe pins of a probe card from being uniformly pressed against the semiconductor wafer, thus making it impossible to perform inspections for electric characteristics of the semiconductor wafer. Accordingly, it is preferable that the wafer placing surface exhibits warpage of 10 μM or less, when a force of 3.1 MPa is applied to the surface of chuck-top conductive layer 3.

The wafer holding member according to the present invention can be used for heating and inspecting to-be-processed objects such as semiconductor wafers. Wafer holding member 1 according to the present invention can be suitably applied to a wafer prober, a handler apparatus or a tester apparatus, since such apparatuses can effectively utilize the characteristics of wafer holding member 1 according to the present invention having higher rigidity and a higher heat conductivity.

EXAMPLE 1

A chuck top with a diameter of 310 mm and a thickness of 10 mm made of a Si—SiC composite was prepared. On one surface of the chuck top, concentrical grooves and through holes for vacuum-chucking a semiconductor wafer were formed, and further nickel plating was applied to the surface to form a chuck-top conductive layer.

Thereafter, polishing processing was applied to the chuck-top conductive layer to make the wafer placing surface which is the surface of the chuck-top conductive layer to have warpage of 10 μm and to make the surface of the chuck-top conductive layer to have a surface roughness Ra of 0.02 μm.

A heat generating member was mounted to the chuck top, wherein the heat generating member had a circuit made of a stainless steel which had been etched. Further, an insulating member made of a silicon resin containing boron nitride dispersed therein was inserted between the chuck top and the heat generating member.

Next, as a supporting member, a circular-cylindrical shaped mullite-alumina composite member with a diameter of 310 mm and a thickness of 40 mm was prepared. Spot-facing processing with a diameter of 285 mm and a depth of 20 mm was applied to the supporting member to form a hollow cavity portion within the supporting member. A cooling pipe (Table 1 illustrates the materials of cooling pipes and the diameters of the cross-sectional areas of the cooling pipes) was installed on the bottom portion of the supporting member formed as described above. Further, cooling pipes having a plate-shaped member mounted thereto through welding were prepared.

The chuck top and the supporting member fabricated as described above were bonded to each other. As described above, wafer holding members designated as No. 1 to No. 16 illustrated in Table .1 were fabricated, wherein the wafer holding members include a cavity portion formed between the chuck top and the bottom portion of the supporting member facing to the chuck top and having a cooling mechanism in the cavity portion. The wafer holding member of No. 1 was fabricated without installing a cooling pipe and a plate-shaped member therein.

Further, for the wafer holding members of No. 2 to No. 16, a fluid (Table 1 illustrates the types and the temperatures of fluids) was flowed through the cooling pipe, and the heat generating member mounted to the chuck top was energized to raise the temperature of the wafer placing surface to 200° C. After the temperature was maintained at 200° C. for 5 hours, the temperature of the bottom portion of the supporting member was measured. On the other hand, for the wafer holding member of No. 1, the heat generating member mounted to the chuck top was energized, without flowing a fluid, to raise the temperature of the wafer placing surface to 200° C. After the temperature was maintained at 200° C. for 5 hours, the temperature of the bottom portion of the supporting member was measured. Table 1 illustrates the results.

TABLE 1

| WAFER HOLDING MEMBER | COOLING PIPE | | | FLUID | | PLATE-SHAPED MEMBER | | SUPPORTING MEMBER TEMPERATURE OF BOTTOM PORTION (° C.) |
|---|---|---|---|---|---|---|---|---|
| | MATERIAL | DIAMETER OF CROSS-SECTIONAL AREA (mm) | TYPE | TEMPERATURE (° C.) | FLOW RATE (LITER/MIN) | MATERIAL | INSTALLATION POSITION | |
| No. 1 | NONE | NONE | NONE | NONE | NONE | NONE | NONE | 130 |
| No. 2 | COPPER | 6 | AIR | 25 | 10 | NONE | NONE | 125 |
| No. 3 | COPPER | 6 | AIR | 25 | 50 | NONE | NONE | 110 |
| No. 4 | COPPER | 6 | AIR | 25 | 100 | NONE | NONE | 100 |
| No. 5 | COPPER | 6 | AIR | 25 | 300 | NONE | NONE | 80 |
| No. 6 | COPPER | 10 | AIR | 25 | 100 | NONE | NONE | 102 |
| No. 7 | ALUMINUM | 6 | AIR | 25 | 100 | NONE | NONE | 100 |

TABLE 1-continued

| WAFER HOLDING MEMBER | MATERIAL | COOLING PIPE DIAMETER OF CROSS-SECTIONAL AREA (mm) | TYPE | FLUID TEMPERATURE (° C.) | FLOW RATE (LITER/MIN) | PLATE-SHAPED MEMBER MATERIAL | INSTALLATION POSITION | SUPPORTING MEMBER TEMPERATURE OF BOTTOM PORTION (° C.) |
|---|---|---|---|---|---|---|---|---|
| No. 8 | STAINLESS STEEL | 6 | AIR | 25 | 100 | NONE | NONE | 110 |
| No. 9 | COPPER | 6 | NITROGEN | 25 | 100 | NONE | NONE | 100 |
| No. 10 | COPPER | 6 | AIR | 25 | 100 | COPPER | SUPPORTING-MEMBER SIDE | 90 |
| No. 11 | COPPER | 6 | AIR | 25 | 300 | COPPER | SUPPORTING-MEMBER SIDE | 65 |
| No. 12 | COPPER | 6 | WATER | 25 | 4 | NONE | NONE | 50 |
| No. 13 | COPPER | 6 | GALDEN | 25 | 4 | NONE | NONE | 60 |
| No. 14 | COPPER | 6 | GALDEN | −20 | 4 | NONE | NONE | 58 |
| No. 15 | COPPER | 6 | AIR | 25 | 100 | COPPER | CHUCK-TOP SIDE | 100 |
| No. 16 | COPPER | 6 | AIR | 25 | 100 | COPPER | BOTH SIDES | 90 |

The results illustrated in Table 1 reveal that the wafer holding members of No. 2 to No. 16, which were cooled by flowing the fluid illustrated in Table 1 through the cooling pipe provided in the cavity portion of the wafer holding member, could cool the bottom portion of the supporting member more efficiently, than the wafer holding member of No. 1 which was not cooled.

Further, it can be seen that the wafer holding members of Nos. 10 to 11 and Nos. 15 to 16, which were provided with a plate-shaped member made of copper, could cool the bottom portion of the supporting member further efficiently.

Further, the wafer holding members Nos. 15 to 16 could cool the chuck top, when the cooling pipe was made movable within the supporting member, through an air cylinder.

EXAMPLE 2

A chuck top having the same configuration as that in the example 1 was prepared. Further, a supporting member having a cooling pipe and/or a plate-shaped member mounted thereto was prepared, wherein the cooling pipe and/or the plate-shaped member had the same configurations as those in the example 1. Further, 32 circular-cylindrical shaped mullite-alumina composite members with a diameter of 5 mm and a height of 5 mm were prepared and placed between the chuck top and the supporting member along a single circumference at even intervals. As described above, wafer holding members Nos: 17 to 32 illustrated in Table 2 were fabricated. Further, the wafer holding member of No. 17 was fabricated without installing a cooling pipe and a plate-shaped member therein.

Further, similarly to the example 1, for the wafer holding members of No. 18 to No. 32, a fluid (Table 2 illustrates the types and the temperatures of fluids) was flowed through the cooling pipe, and the heat generating member mounted to the chuck top was energized to raise the temperature of the wafer placing surface to 200° C. After the temperature was maintained at 200° C. for 5 hours, the temperature of the bottom portion of the supporting member was measured. On the other hand, for the wafer holding member of No. 17, the heat generating member mounted to the chuck top was energized, without flowing a fluid, to raise the temperature of the wafer placing surface to 200° C. After the temperature was maintained at 200° C. for 5 hours, the temperature of the bottom portion of the supporting member was measured. Table 2 illustrates the results.

TABLE 2

| WAFER HOLDING MEMBER | MATERIAL | COOLING PIPE DIAMETER OF CROSS-SECTIONAL AREA (mm) | TYPE | FLUID TEMPERATURE (° C.) | FLOW RATE (LITER/MIN) | PLATE-SHAPED MEMBER MATERIAL | INSTALLATION POSITION | SUPPORTING MEMBER TEMPERATURE OF BOTTOM PORTION (° C.) |
|---|---|---|---|---|---|---|---|---|
| No. 17 | NONE | NONE | NONE | NONE | NONE | NONE | NONE | 115 |
| No. 18 | COPPER | 6 | AIR | 25 | 10 | NONE | NONE | 111 |
| No. 19 | COPPER | 6 | AIR | 25 | 50 | NONE | NONE | 97 |
| No. 20 | COPPER | 6 | AIR | 25 | 100 | NONE | NONE | 88 |
| No. 21 | COPPER | 6 | AIR | 25 | 300 | NONE | NONE | 71 |
| No. 22 | COPPER | 10 | AIR | 25 | 100 | NONE | NONE | 90 |
| No. 23 | ALUMINUM | 6 | AIR | 25 | 100 | NONE | NONE | 88 |
| No. 24 | STAINLESS STEEL | 6 | AIR | 25 | 100 | NONE | NONE | 97 |

TABLE 2-continued

| WAFER HOLDING MEMBER | MATERIAL | COOLING PIPE | | | | PLATE-SHAPED MEMBER | | SUPPORTING MEMBER TEMPERATURE OF BOTTOM PORTION (° C.) |
|---|---|---|---|---|---|---|---|---|
| | | DIAMETER OF CROSS-SECTIONAL AREA (mm) | TYPE | FLUID | | | | |
| | | | | TEMPERATURE (° C.) | FLOW RATE (LITER/MIN) | MATERIAL | INSTALLATION POSITION | |
| No. 25 | COPPER | 6 | NITROGEN | 25 | 100 | NONE | NONE | 88 |
| No. 26 | COPPER | 6 | AIR | 25 | 100 | COPPER | SUPPORTING-MEMBER SIDE | 80 |
| No. 27 | COPPER | 6 | AIR | 25 | 300 | COPPER | SUPPORTING-MEMBER SIDE | 58 |
| No. 28 | COPPER | 6 | WATER | 25 | 4 | NONE | NONE | 44 |
| No. 29 | COPPER | 6 | GALDEN | 25 | 4 | NONE | NONE | 53 |
| No. 30 | COPPER | 6 | GALDEN | −20 | 4 | NONE | NONE | 51 |
| No. 31 | COPPER | 6 | AIR | 25 | 100 | COPPER | CHUCK-TOP SIDE | 88 |
| No. 32 | COPPER | 6 | AIR | 25 | 100 | COPPER | BOTH SIDES | 80 |

As can be seen from the comparison between Table 1 and Table 2, the insertion of the cylindrical-shaped members between the chuck top and the supporting member is effective in the heat insulation for the bottom portion of the supporting member.

EXAMPLE 3

A chuck top and a supporting member having the same configurations as those in the example 1 were prepared. Further, two types of disk-shaped plate-shaped members with a diameter of 280 mm and thickness of 6 mm and 2 mm made of materials illustrated in Table 3 were prepared. A portion of the plate-shaped member with a thickness of 6 mm having a half-circle shape with a radius of 4 mm was removed therefrom to form a groove. Further, these plate-shaped members were bonded to each other using screws when the fluid to be flowed through the groove is gas, while these plate-shaped members were bonded to each other through welding when the fluid to be flowed through the groove is liquid. The bonded plate-shaped members having a flow channel with a half-circle shaped cross-sectional area were installed in the cavity portion within the supporting member. As described above, wafer holding members Nos. 33 to 39 illustrated in Table 3 were fabricated. Further, the wafer holding member No. 33 was fabricated without installing the aforementioned bonded plate-shaped members therein.

Further, similarly to the example 1, for the wafer holding members No. 34 to No. 39, a fluid (Table 3 illustrates the types and the temperatures of fluids) was flowed through the flow channel in the bonded plate-shaped members, and the heat generating member mounted to the chuck top was energized to raise the temperature of the wafer placing surface to 200° C. After the temperature was maintained at 200° C. for 5 hours, the temperature of the bottom portion of the supporting member was measured. On the other hand, for the wafer holding member No. 33, the heat generating member mounted to the chuck top was energized, without flowing a fluid, to raise the temperature of the wafer placing surface to 200° C. After the temperature was maintained at 200° C. for 5 hours, the temperature of the bottom portion of the supporting member was measured. Table 3 illustrates the results.

TABLE 3

| WAFER HOLDING MEMBER | FLOW CHANNEL RADIUS (mm) | FLUID | | | PLATE-SHAPED MEMBER MATERIAL | SUPPORTING MEMBER TEMPERATURE OF BOTTOM PORTION (° C.) |
|---|---|---|---|---|---|---|
| | | TYPE | TEMPERATURE (° C.) | FLOW RATE (LITER/MIN) | | |
| No. 33 | NONE | NONE | NONE | NONE | NONE | 115 |
| No. 34 | 4 | AIR | 25 | 100 | COPPER | 74 |
| No. 35 | 4 | AIR | 25 | 300 | COPPER | 55 |
| No. 36 | 4 | AIR | 25 | 100 | ALUMINUM | 78 |
| No. 37 | 4 | AIR | 25 | 100 | STAINLESS STEEL | 82 |
| No. 38 | 4 | WATER | 25 | 4 | COPPER | 42 |
| No. 39 | 4 | GALDEN | 25 | 4 | COPPER | 48 |

As can be seen from Table 3, the wafer holding members Nos. 34 to 39 having the flow channel formed therein could cool the supporting member more efficiently, by flowing the fluid through the flow channel, than the wafer holding member No. 33 having no flow channel formed therein, wherein the flow channels in the wafer holding members Nos. 34 to 39 were formed by installing the bonded plate-shaped members having the flow channel with the half-circle shaped cross-sectional area in the cavity portion within the supporting member. Further, they could cool the chuck top, when the bonded plate-shaped members having the aforementioned flow channel formed therein were made movable within the supporting member through an air cylinder.

EXAMPLE 4

A chuck top and a supporting member having the same configurations as those in the example 1 were prepared. However, a half-circle shaped portion with a radius of 4 mm was removed from the surface of the bottom portion of the supporting member (surface facing to the cavity portion) to form a groove. Further, disk shaped plate-shaped members with a diameter of 280 mm and a thickness of 4 mm made of materials illustrated in Table 4 were prepared, and these plate-shaped members were secured through screws to the surface of the bottom portion having the groove formed therein to form a flow channel. Thereafter, the chuck top was bonded to the supporting member. As described above, wafer holding members Nos. 40 to 46 illustrated in Table 4 were fabricated. Further, the wafer holding member No. 40 was fabricated without forming a groove in the surface of the bottom portion of the supporting member.

Further, similarly to the example 1, for the wafer holding members No. 41 to No. 46, a fluid (Table 4 illustrates the types and the temperatures of fluids) was flowed through the aforementioned flow channel, and the heat generating member mounted to the chuck top was energized to raise the temperature of the wafer placing surface to 200° C. After the temperature was maintained at 200° C. for 5 hours, the temperature of the bottom portion of the supporting member was measured. On the other hand, for the wafer holding member No. 40, the heat generating member mounted to the chuck top was energized, without flowing a fluid, to raise the temperature of the wafer placing surface to 200° C. After the temperature was maintained at 200° C. for 5 hours, the temperature of the bottom portion of the supporting member was measured. Table 4 illustrates the results.

the aforementioned flow channel, could cool the bottom portion of the supporting member more efficiently, than the wafer holding member No. 40 which was not cooled.

EXAMPLE 5

A chuck top and a supporting member having the same configurations as those in the example 1 were prepared. Further, plate-shaped members with a diameter of 280 mm and a thickness of 6 mm made of materials illustrated in FIG. 5 were prepared. Further, a half-circle shaped groove with a radius of 4 mm was formed in the plate-shaped members, and the plate-shaped members were secured, through screws, in the cavity portion within the supporting member, with the surface having the groove formed therein faced to the bottom portion of the supporting member, to form a flow channel with a half-circle shaped cross-sectional area. Thereafter, the chuck top was bonded to the supporting member. As described above, wafer holding members Nos. 47 to 53 illustrated in Table 5 were fabricated. The wafer holding member No. 47 illustrated in Table 5 was fabricated without installing a plate-shaped member therein.

Further, similarly to the example 1, for the wafer holding members No. 48 to No. 53, a fluid (Table 5 illustrates the types and the temperatures of fluids) was flowed through the aforementioned flow channel, and the heat generating member mounted to the chuck top was energized to raise the temperature of the wafer placing surface to 200° C. After the temperature was maintained at 200° C. for 5 hours, the temperature of the bottom portion of the supporting member was measured. On the other hand, for the wafer holding member No. 47, the heat generating member mounted to the chuck top was energized, without flowing a fluid, to raise the temperature of the wafer placing surface to 200° C. After the temperature was maintained at 200° C. for 5 hours, the tempera-

TABLE 4

| WAFER HOLDING MEMBER | FLUID | | | PLATE-SHAPED MEMBER MATERIAL | SUPPORTING MEMBER TEMPERATURE OF BOTTOM PORTION (° C.) |
|---|---|---|---|---|---|
| | TYPE | TEMPERATURE (° C.) | FLOW RATE (LITER/MIN) | | |
| No. 40 | NONE | NONE | NONE | NONE | 115 |
| No. 41 | AIR | 25 | 100 | COPPER | 72 |
| No. 42 | AIR | 25 | 300 | COPPER | 54 |
| No. 43 | AIR | 25 | 100 | ALUMINUM | 77 |
| No. 44 | AIR | 25 | 100 | STAINLESS STEEL | 80 |
| No. 45 | NITROGEN | 25 | 100 | COPPER | 72 |
| No. 46 | HELIUM | 25 | 100 | COPPER | 69 |

As can be seen from Table 4, the wafer holding members Nos. 41 to 46, which were cooled by flowing the fluid through ture of the bottom portion of the supporting member was measured. Table 5 illustrates the results.

TABLE 5

| WAFER HOLDING MEMBER | FLUID | | | PLATE-SHAPED MEMBER MATERIAL | SUPPORTING MEMBER TEMPERATURE OF BOTTOM PORTION (° C.) |
|---|---|---|---|---|---|
| | TYPE | TEMPERATURE (° C.) | FLOW RATE (LITER/MIN) | | |
| No. 47 | NONE | NONE | NONE | NONE | 115 |
| No. 48 | AIR | 25 | 100 | COPPER | 74 |

TABLE 5-continued

| WAFER HOLDING MEMBER | FLUID TYPE | TEMPERATURE (° C.) | FLOW RATE (LITER/MIN) | PLATE-SHAPED MEMBER MATERIAL | SUPPORTING MEMBER TEMPERATURE OF BOTTOM PORTION (° C.) |
|---|---|---|---|---|---|
| No. 49 | AIR | 25 | 300 | COPPER | 55 |
| No. 50 | AIR | 25 | 100 | ALUMINUM | 79 |
| No. 51 | AIR | 25 | 100 | STAINLESS STEEL | 83 |
| No. 52 | NITROGEN | 25 | 100 | COPPER | 73 |
| No. 53 | HELIUM | 25 | 100 | COPPER | 70 |

As can be seen from Table 5, the wafer holding members Nos. 48 to 53, which were cooled by flowing the fluid through the aforementioned flow channel, could cool the bottom portion of the supporting member more efficiently, than the wafer holding member No. 47 which was not cooled.

EXAMPLE 6

A chuck top having the same configuration as that in the example 1 was prepared. Further, a supporting member having a cooling pipe and/or a plate-shaped member mounted thereto was prepared, wherein the cooling pipe and/or the plate-shaped member had the same configurations as those in the example 1. Further, wafer holding members of Nos. 54 to 69 illustrated in Table 6 were fabricated, in the same way as that of the example 1. Further, in the wafer holding members No. 55 to No. 69, the cooling pipe and/or the plate-shaped member were mounted therein such that they were in contact with the lower portion of the chuck top. Further, the wafer holding member No. 54 was fabricated without installing a cooling pipe and a plate-shaped member.

Further, for the wafer holding members No. 55 to No. 69, a fluid (Table 6 illustrates the types and the temperatures of fluids) was flowed through the cooling pipe, and the heat generating member mounted to the chuck top was energized to raise the temperature of the wafer placing surface to 200° C. After the temperature was maintained at 200° C. for 5 hours, the temperature of the bottom portion of the supporting member was measured. On the other hand, for the wafer holding member No. 54, the heat generating member mounted to the chuck top was energized, without flowing a fluid, to raise the temperature of the wafer placing surface to 200° C. After the temperature was maintained at 200° C. for 5 hours, the temperature of the bottom portion of the supporting member was measured. Table 6 illustrates the results.

TABLE 6

| WAFER HOLDING MEMBER | COOLING PIPE | | FLUID | | | PLATE-SHAPED MEMBER | | SUPPORTING MEMBER TEMPERATURE OF BOTTOM PORTION (° C.) |
|---|---|---|---|---|---|---|---|---|
| | MATERIAL | DIAMETER OF CROSS-SECTIONAL AREA (mm) | TYPE | TEMPERATURE (° C.) | FLOW RATE (LITER/MIN) | MATERIAL | INSTALLATION POSITION | |
| No. 54 | NONE | NONE | NONE | NONE | NONE | NONE | NONE | 121 |
| No. 55 | COPPER | 6 | AIR | 25 | 10 | NONE | NONE | 117 |
| No. 56 | COPPER | 6 | AIR | 25 | 50 | NONE | NONE | 102 |
| No. 57 | COPPER | 6 | AIR | 25 | 100 | NONE | NONE | 92 |
| No. 58 | COPPER | 6 | AIR | 25 | 300 | NONE | NONE | 75 |
| No. 59 | COPPER | 10 | AIR | 25 | 100 | NONE | NONE | 95 |
| No. 60 | ALUMINUM | 6 | AIR | 25 | 100 | NONE | NONE | 92 |
| No. 61 | STAINLESS STEEL | 6 | AIR | 25 | 100 | NONE | NONE | 103 |
| No. 62 | COPPER | 6 | NITROGEN | 25 | 100 | NONE | NONE | 93 |
| No. 63 | COPPER | 6 | AIR | 25 | 100 | COPPER | SUPPORTING-MEMBER SIDE | 84 |
| No. 64 | COPPER | 6 | AIR | 25 | 300 | COPPER | SUPPORTING-MEMBER SIDE | 61 |
| No. 65 | COPPER | 6 | WATER | 25 | 4 | NONE | NONE | 47 |
| No. 66 | COPPER | 6 | GALDEN | 25 | 4 | NONE | NONE | 57 |
| No. 67 | COPPER | 6 | GALDEN | −20 | 4 | NONE | NONE | 55 |
| No. 68 | COPPER | 6 | AIR | 25 | 100 | COPPER | CHUCK-TOP SIDE | 92 |
| No. 69 | COPPER | 6 | AIR | 25 | 100 | COPPER | BOTH SIDES | 84 |

As can be seen from Table 6, the wafer holding members Nos. 55 to 69, which were cooled by the cooling mechanism installed in contact with the lower portion of the chuck top, could cool the bottom portion of the supporting member more efficiently, than the wafer holding member No. 54 which was not cooled.

The term "Supporting-Member Side" in the field of the installation position of the plate-shaped member in Tables 1, 2 and 6 indicates that the plate-shaped member was installed on the surface of the cooling pipe facing to the supporting member, the term "Chuck-Top Side" indicates that the plate-shaped member was installed on the surface of the cooling pipe facing to the chuck top, and the term "Both Sides" indicates that the plate-shaped members were installed on both the surfaces of the cooling pipe that face to the supporting member and the chuck top.

The wafer prober employing the wafer holding member according to the present invention includes the cooling mechanism in the cavity portion formed between the chuck top and the bottom portion of the supporting member and, thus, is capable of efficiently cooling the supporting member, which can improve the accuracy of the driving system below the supporting member, thereby enabling accurate probing and increasing the throughput.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wafer holding member for use in a wafer prober for inspecting a semiconductor wafer, comprising:
   a chuck top; and
   a supporting member for supporting said chuck top,
   wherein said supporting member has a bottom portion facing to said chuck top and a supporting surface contacting with said chuck top, a cavity portion is formed between said chuck top and the bottom portion of said supporting member, and there is provided, in said cavity portion, at least a portion of a cooling mechanism for cooling at least one of said chuck top and said supporting member, and there is provided a heat-insulating configuration at said supporting surface, and
   said heat-insulating configuration is fabricated by cutting a portion of said supporting surface away to form a groove.

2. The wafer holding member according to claim 1, wherein said cooling mechanism includes a flow channel for flowing a fluid therethrough.

3. The wafer holding member according to claim 2, wherein a plate-shaped member is provided on at least one of a surface of said flow channel facing to said chuck top and a surface of said flow channel facing to the bottom portion of said supporting member.

4. The wafer holding member according to claim 1, wherein at least the portion of said cooling mechanism is provided in said cavity portion near the bottom portion of said supporting member.

5. The wafer holding member according to claim 1, wherein at least the portion of said cooling mechanism is provided in said cavity portion near said chuck top.

6. The wafer holding member according to claim 1, wherein said cooling mechanism is of a movable type.

7. A wafer prober comprising the wafer holding member according to claim 1.

8. A wafer holding member for use in a wafer prober for inspecting a semiconductor wafer, comprising:
   a chuck top; and
   a supporting member for supporting said chuck top,
   wherein said supporting member has a bottom portion facing to said chuck top and a supporting surface contacting with said chuck top, a cavity portion is formed between said chuck top and the bottom portion of said supporting member, and there is provided, in said cavity portion, at least a portion of a cooling mechanism for cooling at least one of said chuck top and said supporting member, and there is provided a heat-insulating configuration at said supporting surface, and
   said heat-insulating configuration is fabricated by installing a column-shaped member on said supporting surface of said supporting member.

9. A wafer holding member for use in a wafer prober for inspecting a semiconductor wafer, comprising:
   a chuck top; and
   a supporting member for supporting said chuck top,
   wherein said supporting member has a bottom portion facing to said chuck top and a supporting surface contacting with said chuck top, a cavity portion is formed between said chuck top and the bottom portion of said supporting member, and there is provided, in said cavity portion, at least a portion of a cooling mechanism for cooling at least one of said chuck top and said supporting member, and there is provided a heat-insulating configuration at said supporting surface, and
   said heat-insulating configuration is fabricated by forming a plurality of protrusions at said supporting surface.

10. The wafer holding member according to claim 8, wherein said cooling mechanism includes a flow channel for flowing a fluid therethrough.

11. The wafer holding member according to claim 10, wherein a plate-shaped member is provided on at least one of a surface of said flow channel facing to said chuck top and a surface of said flow channel facing to the bottom portion of said supporting member.

12. The wafer holding member according to claim 8, wherein at least the portion of said cooling mechanism is provided in said cavity portion near the bottom portion of said supporting member.

13. The wafer holding member according to claim 8, wherein at least the portion of said cooling mechanism is provided in said cavity portion near said chuck top.

14. The wafer holding member according to claim 8, wherein said cooling mechanism is of a movable type.

15. A wafer prober comprising the wafer holding member according to claim 8.

16. The wafer holding member according to claim 9, wherein said cooling mechanism includes a flow channel for flowing a fluid therethrough.

17. The wafer holding member according to claim 16, wherein a plate-shaped member is provided on at least one of a surface of said flow channel facing to said chuck top and a surface of said flow channel facing to the bottom portion of said supporting member.

18. The wafer holding member according to claim 9, wherein at least the portion of said cooling mechanism is provided in said cavity portion near the bottom portion of said supporting member.

19. The wafer holding member according to claim 9, wherein at least the portion of said cooling mechanism is provided in said cavity portion near said chuck top.

20. The wafer holding member according to claim 9, wherein said cooling mechanism is of a movable type.

21. A wafer prober comprising the wafer holding member according to claim 9.

* * * * *